US012078324B2

(12) United States Patent
Mihira et al.

(10) Patent No.: US 12,078,324 B2
(45) Date of Patent: Sep. 3, 2024

(54) LAMP UNIT, DOOR TRIM AND MANUFACTURING METHOD OF LAMP UNIT

(71) Applicant: TS TECH CO., LTD., Asaka (JP)

(72) Inventors: Manabu Mihira, Tochigi (JP); Yuji Nakano, Tochigi (JP); Masahiro Nomura, Tochigi (JP)

(73) Assignee: TS TECH CO., LTD., Asaka (JP)

( * ) Notice: Subject to any disclaimer, the term of this patent is extended or adjusted under 35 U.S.C. 154(b) by 0 days.

(21) Appl. No.: 18/471,724

(22) Filed: Sep. 21, 2023

(65) Prior Publication Data

US 2024/0052996 A1 Feb. 15, 2024

Related U.S. Application Data

(63) Continuation of application No. 18/103,575, filed on Jan. 31, 2023, now Pat. No. 11,815,246, which is a
(Continued)

(30) Foreign Application Priority Data

Dec. 26, 2017 (JP) .................................. 2017-249814
Feb. 20, 2018 (JP) .................................. 2018-028280

(51) Int. Cl.
*F21V 19/00* (2006.01)
*B60Q 3/217* (2017.01)
(Continued)

(52) U.S. Cl.
CPC ............ *F21V 19/005* (2013.01); *B60Q 3/217* (2017.02); *B60Q 3/50* (2017.02); *F21V 23/06* (2013.01);
(Continued)

(58) Field of Classification Search
CPC ....... F21V 19/005; F21V 23/06; B60Q 3/217; B60Q 3/50
See application file for complete search history.

(56) References Cited

U.S. PATENT DOCUMENTS

| 6,319,045 B1 | 11/2001 | Sawayanagi et al. |
| 7,258,466 B2 | 8/2007 | Watanabe et al. |
| (Continued) | | |

FOREIGN PATENT DOCUMENTS

| JP | H09245888 A | 9/1997 |
| JP | H1154210 A | 2/1999 |
| (Continued) | | |

OTHER PUBLICATIONS

Japanese Office Action (w/ English translation) for corresponding JP Application No. 2022-182561, dated Aug. 3, 2023, 10 pages.
(Continued)

*Primary Examiner* — Joseph L Williams
(74) *Attorney, Agent, or Firm* — Dority & Manning, P.A.

(57) ABSTRACT

To provide a lamp unit in which rattling of a light-emitting element is prevented, a lamp unit includes: a holder member attached to an attachment object, a base board provided with a light-emitting element coupled on a main surface thereof; a retaining member that engages the holder member to sandwich the base board between the retaining member and the holder member such that the base board is retained at a prescribed position on the holder member; and a cover member that is at least partially light-transmissive and is attached to the holder member such that the cover member cooperates with the holder member to define a housing chamber for housing the base board and the retaining member.

9 Claims, 23 Drawing Sheets

Related U.S. Application Data continuation of application No. 17/385,983, filed on Jul. 27, 2021, now Pat. No. 11,603,984, which is a continuation of application No. 16/635,188, filed as application No. PCT/JP2018/047407 on Dec. 24, 2018, now Pat. No. 11,112,095.

(51) Int. Cl.
  *B60Q 3/50* (2017.01)
  *F21V 23/06* (2006.01)
  *F21W 102/40* (2018.01)
  *F21Y 115/10* (2016.01)

(52) U.S. Cl.
  CPC ...... *F21W 2102/40* (2018.01); *F21Y 2115/10* (2016.08)

(56) References Cited

U.S. PATENT DOCUMENTS

| | | |
|---|---|---|
| 2012/0206929 A1 | 8/2012 | Suzuki et al. |
| 2015/0146433 A1 | 5/2015 | Vinceno et al. |

FOREIGN PATENT DOCUMENTS

| | | |
|---|---|---|
| JP | 2001006782 A | 1/2001 |
| JP | 2001155801 | 6/2001 |
| JP | 2005209535 A | 8/2005 |
| JP | 2011016383 | 1/2011 |
| JP | 2012061997 | 3/2012 |
| JP | 2012166635 | 9/2012 |
| JP | 2017109507 | 6/2017 |
| KR | 20100002378 | 1/2010 |
| WO | WO2013168253 | 11/2013 |

OTHER PUBLICATIONS

Japanese Office Action for JP2018028280, dated Feb. 5, 2019, 4 pages.
Korean Office Action (w/ English translation) for corresponding Korean Application No. 10-2022-7022426, dispatch date Sep. 9, 2022, 13 pages.
PCT International Search Report (w/ English translation) for corresponding PCT PCT/JP2018/047407, mailed Feb. 6, 2019, 5 pages.
Japanese Office Action (w/ English translation) for corresponding Application No. 2023-216490, dated Jul. 2, 2024.

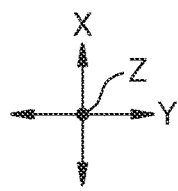
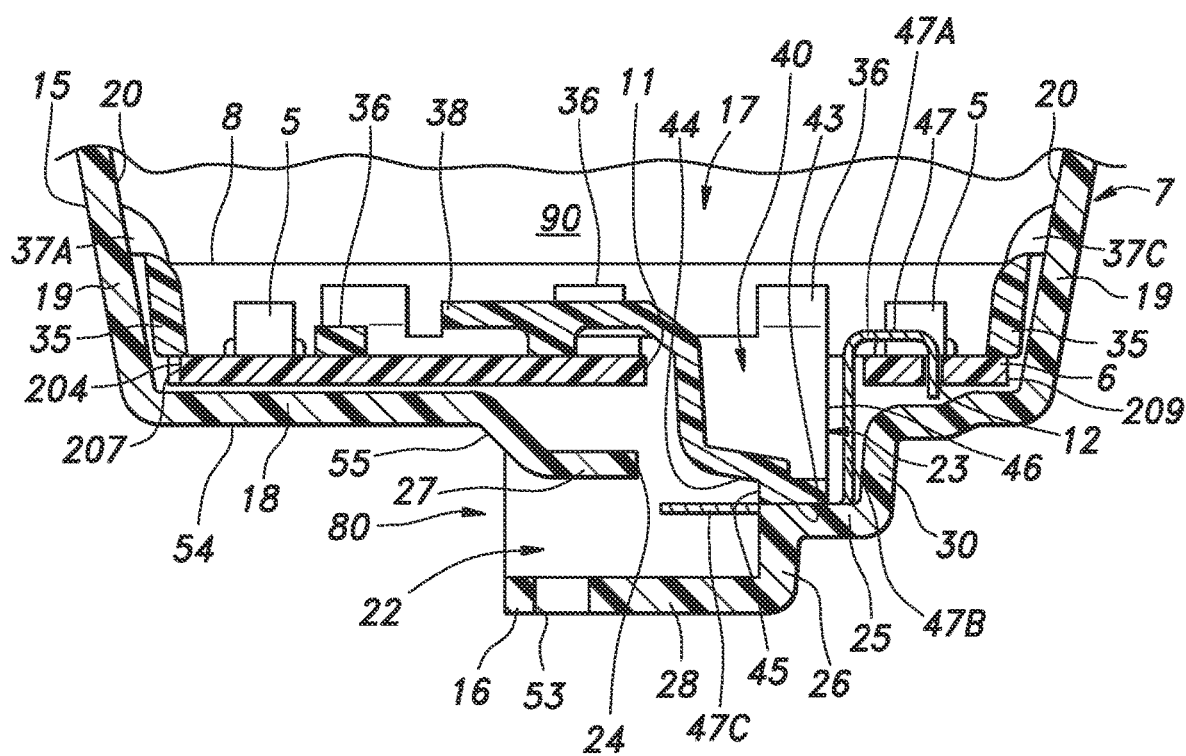
Fig.23

LAMP UNIT, DOOR TRIM AND MANUFACTURING METHOD OF LAMP UNIT

CROSS REFERENCE TO RELATED APPLICATIONS

This application is a continuation of U.S. patent application Ser. No. 18/103,575, filed on Jan. 31, 2023, which is, in turn, a continuation of U.S. patent application Ser. No. 17/385,983, filed on Jul. 27, 2021 (now U.S. Pat. No. 11,603,984, issued on Mar. 14, 2023), which, in turn, is a continuation of U.S. patent application Ser. No. 16/635,188, filed on Jan. 30, 2020 (now U.S. Pat. No. 11,112,095, issued on Sep. 7, 2021), which is, in turn, the U.S. National Stage entry of International Application No. PCT/JP2018/047407, filed on Dec. 24, 2018, which, in turn, claims priority to Japanese Patent Application No. 2017-249814, filed on Dec. 26, 2017, and Japanese Patent Application No. 2018-028280, filed on Feb. 20, 2018, all of which are incorporated herein by reference in their entireties for all purposes.

TECHNICAL FIELD

The present invention relates to a lamp unit equipped with a light-emitting element, and a vehicle door equipped with a lamp unit.

BACKGROUND ART

There is known a lamp unit configured to emit light to illuminate a foot area of a vehicle occupant when a vehicle door is opened (for example, Patent Document 1). The lamp unit of Patent Document 1 includes a light-emitting element. The light-emitting element is coupled to a busbar, which is a metal plate provided on a functional part. The functional part is fitted into a decorative part mounted on an assembling portion of the vehicle door.

PRIOR ART DOCUMENT(S)

Patent Document(s)

Patent Document 1: JP2012-166635A

SUMMARY OF THE INVENTION

Task to be Accomplished by the Invention

Because the light-emitting element is coupled to the busbar, there is a problem that the light-emitting element may rattle relative to a holder member.

In view of such background, an object of the present invention is to provide a lamp unit in which rattling of the light-emitting element is prevented, and a vehicle door equipped with such a lamp unit.

Means to Accomplish the Task

To achieve the above object, a lamp unit (4, 94, 194) according to one embodiment of the present invention comprises: a holder member (9) configured to be attached to an attachment object (3); a base board (6) provided with a light-emitting element (5) coupled on a main surface thereof; a retaining member (8) that engages the holder member to sandwich the base board between the retaining member and the holder member such that the base board is retained at a prescribed position on the holder member; and a cover member (9) that is at least partially light-transmissive and is attached to the holder member such that the cover member cooperates with the holder member to define a housing chamber (90) for housing the base board and the retaining member.

According to this embodiment, because the light-emitting element is coupled on the main surface of the base board and the base board is sandwiched by the holder member and the retaining member, rattling of the light-emitting element relative to the holder member can be prevented.

Further, according to one embodiment of the present invention, preferably, the holder member has a housing recess for housing the base board and the retaining member, and an inner surface of the holder member is provided with an engagement portion (37) for locking the retaining member.

According to this embodiment, because the retaining member and the base board are housed in the housing recess, it is possible to prevent damage to the retaining member and the base board.

Further, according to one embodiment of the present invention, preferably, the retaining member has a plate-like shape and is provided with a light passing hole (39) that extends therethrough at a position corresponding to the light-emitting element.

According to this embodiment, the light path from the light-emitting element toward the opening of the housing recess is not obstructed. Further, the formation of the light passing hole can reduce the weight of the retaining member.

Further, according to one embodiment of the present invention, preferably, the retaining member includes an outer frame (35) formed along an edge portion of the base board and multiple beams (36, 38) provided between portions of the outer frame, the outer frame and the beams defining the light passing hole, and the engagement portion engages the outer frame.

According to this embodiment, the base board can be fixed to the holder member without obstructing the light path from the light-emitting element toward the opening of the housing recess.

Further, according to one embodiment of the present invention, preferably, the retaining member is provided with first projections (101) respectively projecting from at least two portions of an outer peripheral surface of the outer frame that face away from each other such that each first projection abuts against a wall surface (111) defining the housing recess.

According to this embodiment, rattling of the retaining member relative to the holder member can be prevented.

Further, according to one embodiment of the present invention, preferably, the retaining member is provided with a pair of second projections (102) that project from the outer frame toward the base board and abut against corresponding end surfaces of the base board to sandwich the base board therebetween.

According to this embodiment, the base board is coupled to the retaining member, and thus, rattling of the base board relative to the holder member can be prevented.

Further, according to one embodiment of the present invention, preferably, a bottom wall of the housing recess is provided with a locking recess (23), and a corresponding part of the retaining member is provided with a locking protrusion (40) that protrudes into the locking recess.

According to this embodiment, when the retaining member moves along the bottom wall of the holder member, the locking protrusion comes into abutment with a wall defining the locking recess, and therefore, the movement of the retaining member along the bottom wall of the holder member can be restricted.

Further, according to one embodiment of the present invention, preferably, the base board is formed with a through-hole (11) that extends therethrough at a position opposing the locking recess, and the locking protrusion passes through the through-hole and is fitted into the locking recess.

According to this embodiment, because the locking protrusion is inserted into the through-hole provided in the base board, the movement of the base board relative to the retaining member in a direction perpendicular to the protruding direction of the locking protrusion can be restricted. Further, because the holder member is coupled to the retaining member, the movement of the base board relative to the holder member in a direction along the bottom wall of the holder member can be restricted.

Further, according to one embodiment of the present invention, preferably, the holder member is provided with a connector insertion recess (22) that extends from an outer surface to pass between the bottom wall of the locking recess and an outer surface of the holder member and reaches the locking recess, and a connection terminal (47) extending from the base board to the connector insertion recess by passing between the locking protrusion and the locking recess.

According to this embodiment, by inserting the connector into the connector insertion recess to make the connector connected with the connection terminal, it is possible to connect the connector with the base board.

Further, according to one embodiment of the present invention, preferably, the locking recess extends along a prescribed axis to reach an approximate center of the connector insertion recess, the connector insertion recess extends substantially perpendicularly to the axis to reach an approximate center of the locking recess, the locking recess and the connector insertion recess are connected to each other, the locking protrusion has a first protruding end surface (43) and a second protruding end surface (44), the first protruding end surface abuts against the bottom wall of the locking recess or the connection terminal, the second protruding end surface cooperates with a wall surface of the connector insertion recess to define a connector insertion hole (80) into which a connector (60) is inserted, and the connection terminal passes between the first protruding end surface and the bottom wall of the locking recess to reach the connector insertion hole.

According to this embodiment, because the connection terminal is sandwiched by the first protruding end surface and the bottom wall of the locking recess, the movement of the connection terminal can be prevented.

Further, according to one embodiment of the present invention, preferably, the bottom wall of the locking recess is formed with a groove (48) for receiving the connection terminal, and the first protruding end surface and the bottom wall of the locking recess abut against each other.

According to this embodiment, the movement of the connection terminal in the direction along the bottom wall of the locking recess can be prevented.

Further, according to one embodiment of the present invention, preferably, the second protruding end surface is positioned on a base end side of the locking protrusion than the first protruding end surface, and a gap is formed between the second protruding end surface and the connection terminal.

According to this embodiment, it is possible to connect the connection terminal and the connector by inserting the connection terminal into a hole provided in the connector.

Further, according to one embodiment of the present invention, preferably, the second protruding end surface is inclined toward the base end in a direction toward an opening of the connector insertion recess.

According to this embodiment, when the connector is inserted, the connector is guided to an appropriate position by the second protruding end surface, and therefore, attachment of the connector is facilitated.

Further, according to one embodiment of the present invention, preferably, the outer surface of the holder member is formed with an inclined surface (55) that is continuous with an opening of the connector insertion recess.

According to this embodiment, when the connector is inserted, the connector is guided by the connector insertion hole, and therefore, attachment of the connector is facilitated.

Further, according to one embodiment of the present invention, preferably, the lamp unit is a courtesy lamp configured to be mounted to a vehicle door.

According to this embodiment, it is possible to provide a courtesy lamp in which rattling of the light-emitting element is prevented.

Further, according to one embodiment of the present invention, preferably, the holder member is integrally formed on a door trim of a vehicle door.

According to this embodiment, the structure becomes simple, and the base board is more reliably prevented from falling off from the door trim.

Further, according to one embodiment of the present invention, preferably, the holder member is provided with a housing recess (17) for housing the base board and the retaining member, a wall defining the housing recess is provided with an engagement portion (37) for locking the retaining member, and the base board is provided with a cutout (204) at a position corresponding to the engagement portion.

According to this embodiment, because the light-emitting element is connected to the main surface of the base board, and the base board is sandwiched by the holder member and the retaining member, rattling of the light-emitting element relative to the holder member can be prevented. In addition, because the retaining member and the base board are housed in the housing recess, it is possible to prevent damage to the retaining member and the base board. Because the cutout is provided at a position corresponding to the engagement portion, the base board is prevented from easily interfering with the engagement portion at the time of assembly, and the assembly of the base board to the holder member becomes easy.

Further, according to one embodiment of the present invention, preferably, the housing recess is defined by a bottom wall (18) and a sidewall (19) provided along an outer edge of the bottom wall, the engagement portion is provided on the sidewall, and the cutout is provided in an outer peripheral edge of the base board.

According to this embodiment, because the cutout is provided in the outer peripheral edge of the base board, it is possible to easily move the base board such that the cutout and the engagement portion are at corresponding positions, and the assembly of the base board to the holder member becomes even easier.

Further, according to one embodiment of the present invention, preferably, the base board is disposed between the bottom wall and the retaining member, and the engagement portion protrudes from the sidewall to be in contact with a front surface of the retaining member.

According to this embodiment, the assembly of the retaining member becomes easy.

Further, according to one embodiment of the present invention, preferably, the base board has a substantially rectangular shape, and the cutout is provided in an approximately central part of one side of the outer peripheral edge of the base board.

According to this embodiment, the load does not tend to be applied to the base board unevenly and deformation of the base board does not occur easily compared to a case where the cutout is shifted toward either end of one side of the outer peripheral edge of the base board.

Further, according to one embodiment of the present invention, preferably, multiple engagement portions are provided on the sidewall, and the cutouts each have such a width that allows at least two of the engagement portions to pass therethrough.

According to this embodiment, because the number of cutouts provided in the base board can be reduced, the cutouts can be easily formed in the base board.

Further, according to one embodiment of the present invention, preferably, the engagement portion is provided on only one side (203) of the outer peripheral edge of the base board.

According to this embodiment, the rigidity of the base board is less likely to be decreased compared to a case where engagement portions are provided on multiple sides of the outer peripheral edge.

Further, according to one embodiment of the present invention, preferably, the retaining member includes a substantially rectangular outer frame (35) forming an outer edge, and the cutout is provided between the outer frame and the bottom wall.

According to this embodiment, because the base board is positioned between the retaining member and the bottom wall even at the cutout, the cutout is prevented from being hit by an object easily. Thereby, deformation of the base board can be prevented more effectively.

Effect of the Invention

According to the foregoing embodiment, because the light-emitting element is connected to the main surface of the base board and the base board is sandwiched by the holder member and the retaining member, it is possible to provide a lamp unit in which rattling of the light-emitting element is prevented.

According to the embodiment wherein the holder member has a housing recess for housing the base board and the retaining member, and an inner surface of the holder member is provided with an engagement portion for locking the retaining member, it is possible to prevent damage to the retaining member and the base board.

According to the embodiment wherein the retaining member has a plate-like shape and is provided with a light passing hole that extends therethrough at a position corresponding to the light-emitting element, the light path from the light-emitting element toward the opening of the housing recess is not obstructed. Further, the formation of the light passing hole can reduce the weight of the retaining member. According to the embodiment wherein the retaining member includes an outer frame and beams, the base board can be fixed to the holder member without obstructing the light path from the light-emitting element toward the opening of the housing recess.

According to the embodiment wherein the retaining member is provided with first projections respectively projecting from at least two portions of an outer peripheral surface of the outer frame that face away from each other such that each first projection abuts against a wall surface defining the housing recess, rattling of the retaining member relative to the holder member can be prevented.

According to the embodiment wherein the retaining member is provided with a pair of second projections that project from the outer frame toward the base board and abut against corresponding end surfaces of the base board to sandwich the base board therebetween, the base board is coupled to the retaining member, and thus, rattling of the base board relative to the holder member can be prevented.

According to the embodiment wherein the locking protrusion is fitted into the locking recess, the movement of the retaining member along the bottom wall of the holder member can be restricted.

According to the embodiment wherein the locking protrusion passes through the through-hole and is fitted into the locking recess, the movement of the retaining member and the base board along the bottom wall of the holder member can be restricted.

According to the embodiment wherein a connector insertion recess is provided, it is possible, by inserting the connector into the connector insertion recess, to connect the connector with the base board via the connection terminal.

According to the embodiment wherein the bottom wall of the locking recess is formed with a groove for receiving the connection terminal, the first protruding end surface and the bottom wall of the locking recess abut against each other, and the second protruding end surface and the connector insertion recess define a connector insertion hole, the connection terminal is sandwiched by the first protruding end surface and the bottom wall of the locking recess, whereby the movement of the connection terminal can be prevented and the connector insertion hole can be formed more easily.

According to the embodiment wherein the bottom wall of the locking recess is formed with a groove for receiving the connection terminal, and the first protruding end surface and the bottom wall of the locking recess abut against each other, the movement of the connection terminal in the direction along the bottom wall of the locking recess can be prevented.

According to the embodiment wherein the second protruding end surface is positioned on a base end side of the locking protrusion than the first protruding end surface, and a gap is formed between the second protruding end surface and the connection terminal, it is possible to connect the connection terminal and the connector by inserting the connection terminal into a hole provided in the connector.

According to the embodiment wherein the second protruding end surface is inclined, when the connector is inserted, the connector is guided to an appropriate position by the second protruding end surface, and therefore, attachment of the connector is facilitated.

According to the embodiment wherein the outer surface of the holder member is formed with an inclined surface that is continuous with an opening of the connector insertion recess, when the connector is inserted, the connector is guided by the connector insertion hole, and therefore, attachment of the connector is facilitated.

According to the embodiment wherein the lamp unit is a courtesy lamp configured to be mounted to a vehicle door, it is possible to provide a courtesy lamp in which rattling of the light-emitting element is prevented.

According to the embodiment wherein the holder member is integrally formed on a door trim of a vehicle door, the structure becomes simple and the base board is more reliably prevented from falling off from the door trim.

Further, the holder member is provided with a housing recess for housing the base board and the retaining member, a wall defining the housing recess is provided with an engagement portion for locking the retaining member, and the base board is provided with a cutout at a position corresponding to the engagement portion. Thus, because the light-emitting element is connected to the main surface of the base board, and the base board is sandwiched by the holder member and the retaining member, rattling of the light-emitting element relative to the holder member can be prevented. In addition, because the retaining member and the base board are housed in the housing recess, it is possible to prevent damage to the retaining member and the base board. Because the cutout is provided at a position corresponding to the engagement portion, the base board is prevented from easily interfering with the engagement portion at the time of assembly, and the assembly of the base board to the holder member becomes easy.

According to the embodiment wherein the housing recess is defined by a bottom wall and sidewall provided along an outer edge of the bottom wall, the engagement portion is provided on the sidewall, and the cutout is provided in an outer peripheral edge of the base board, because the cutout is provided in the outer peripheral edge of the base board, it is possible to easily move the base board such that the cutout and the engagement portion are at corresponding positions, and the assembly of the base board to the holder member becomes even easier.

According to the embodiment wherein the base board is disposed between the bottom wall and the retaining member, and the engagement portion protrudes from the sidewall to be in contact with a front surface of the retaining member, the assembly of the retaining member becomes easy.

According to the embodiment wherein the base board has a substantially rectangular shape, and the cutout is provided in an approximately central part of one side of the outer peripheral edge of the base board, the load does not tend to be applied to the base board unevenly and deformation of the base board does not occur easily compared to a case where the cutout is shifted toward either end of one side of the outer peripheral edge of the base board.

According to the embodiment wherein multiple engagement portions are provided on the sidewall, and the cutouts each have such a width that allow at least two of the engagement portions to pass therethrough, because the number of cutouts provided in the base board can be reduced, the cutouts can be easily formed in the base board.

According to the embodiment wherein the engagement portion is provided on only one side of the outer peripheral edge of the base board, the rigidity of the base board is unlikely to be decreased compared to a case where engagement members are provided on multiple sides of the outer peripheral edge.

According to the embodiment wherein the retaining member includes a substantially rectangular outer frame forming an outer edge, and the cutout is provided between the outer frame and the bottom wall, because the base board is positioned between the retaining member and the bottom wall even at the cutout, the cutout is prevented from being hit by an object easily. Thereby, deformation of the base board can be prevented more effectively.

BRIEF DESCRIPTION OF THE DRAWINGS

FIG. 23 is a sectional view of the lamp unit according to the third embodiment in a direction along XY plane.

MODES FOR CARRYING OUT THE INVENTION

In the following, an example in which a lamp unit of the present invention is applied to a courtesy lamp mounted to a vehicle door for a driver's seat will be described with reference to the drawings.

First Embodiment

Figure 1:
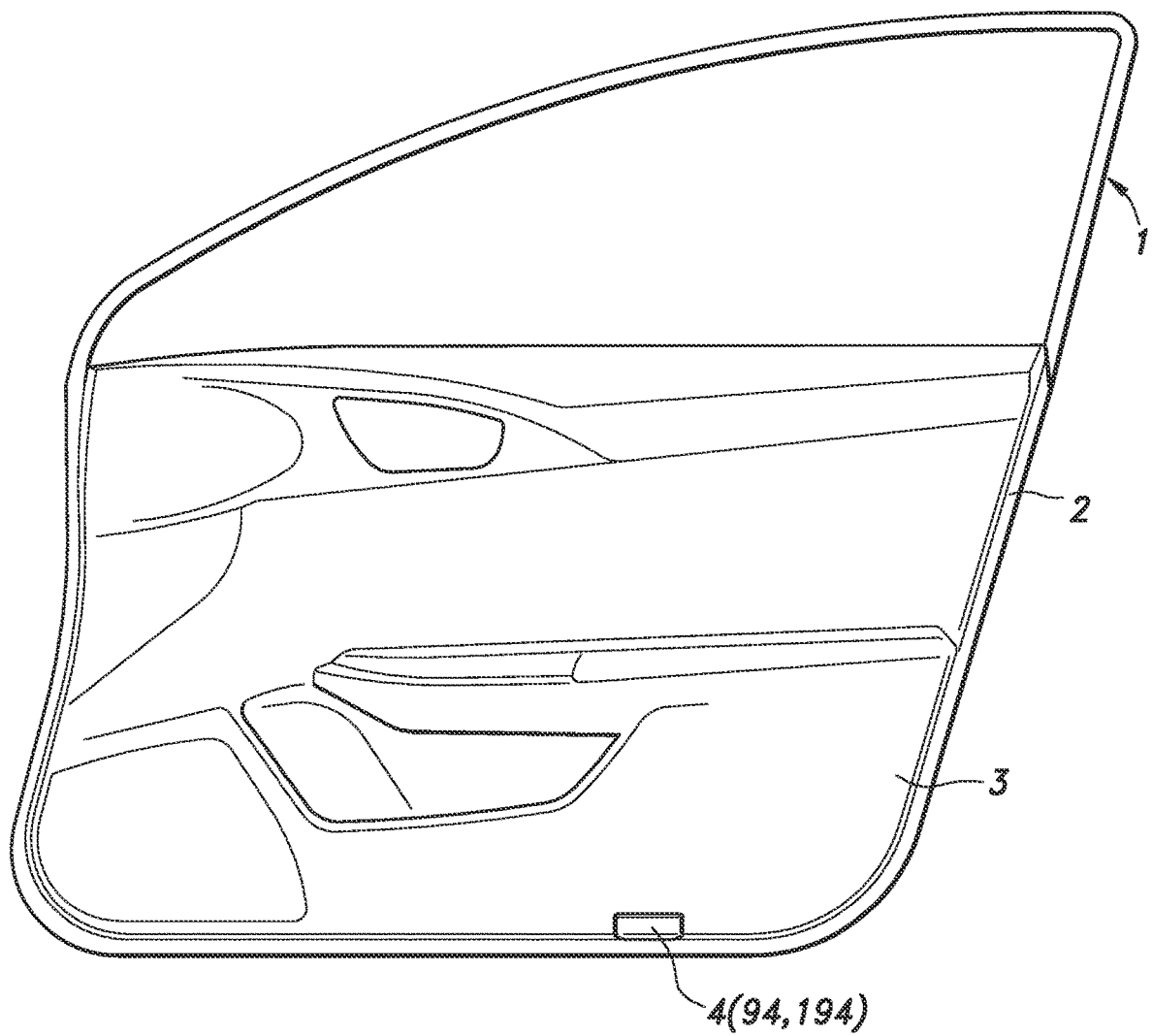
FIG. 1 is a side view of a vehicle door to which a lamp unit according to an embodiment is attached.
Figure 2:
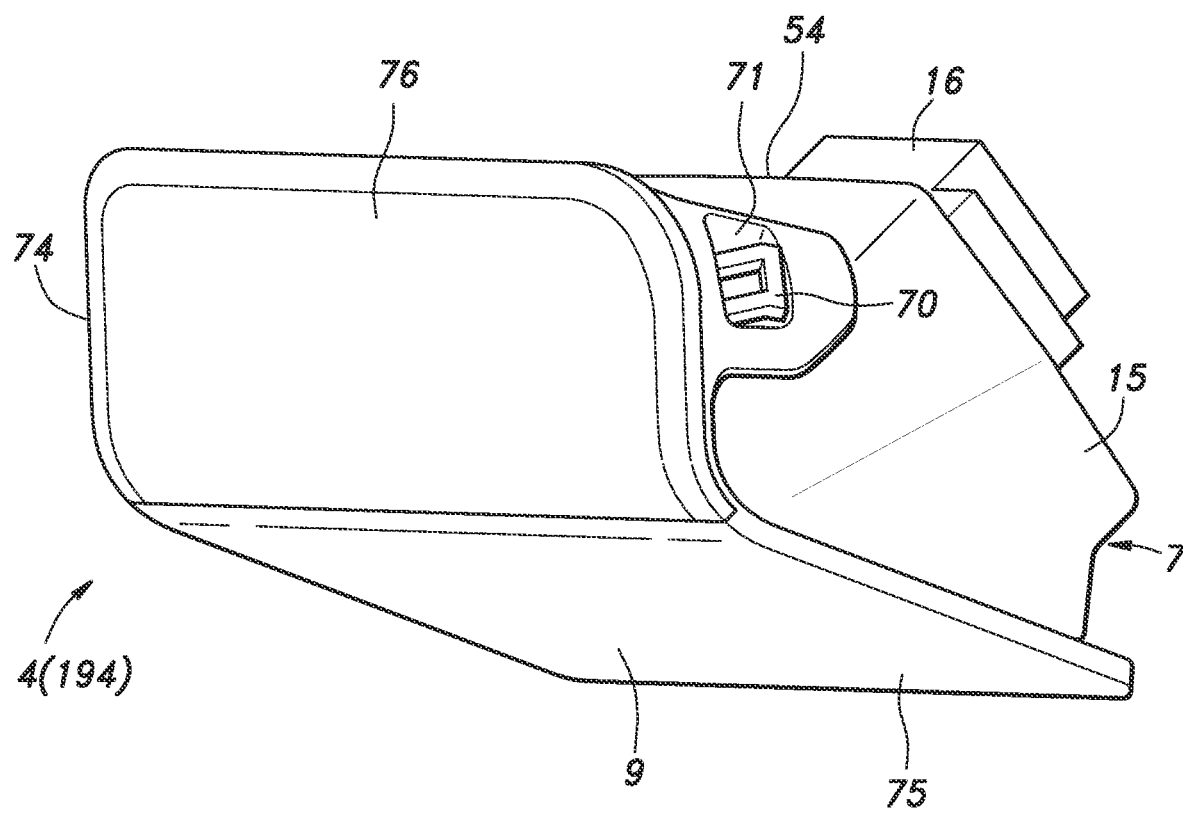
FIG. 2 is a perspective view of the lamp unit as viewed from the right rear side.
Figure 3:
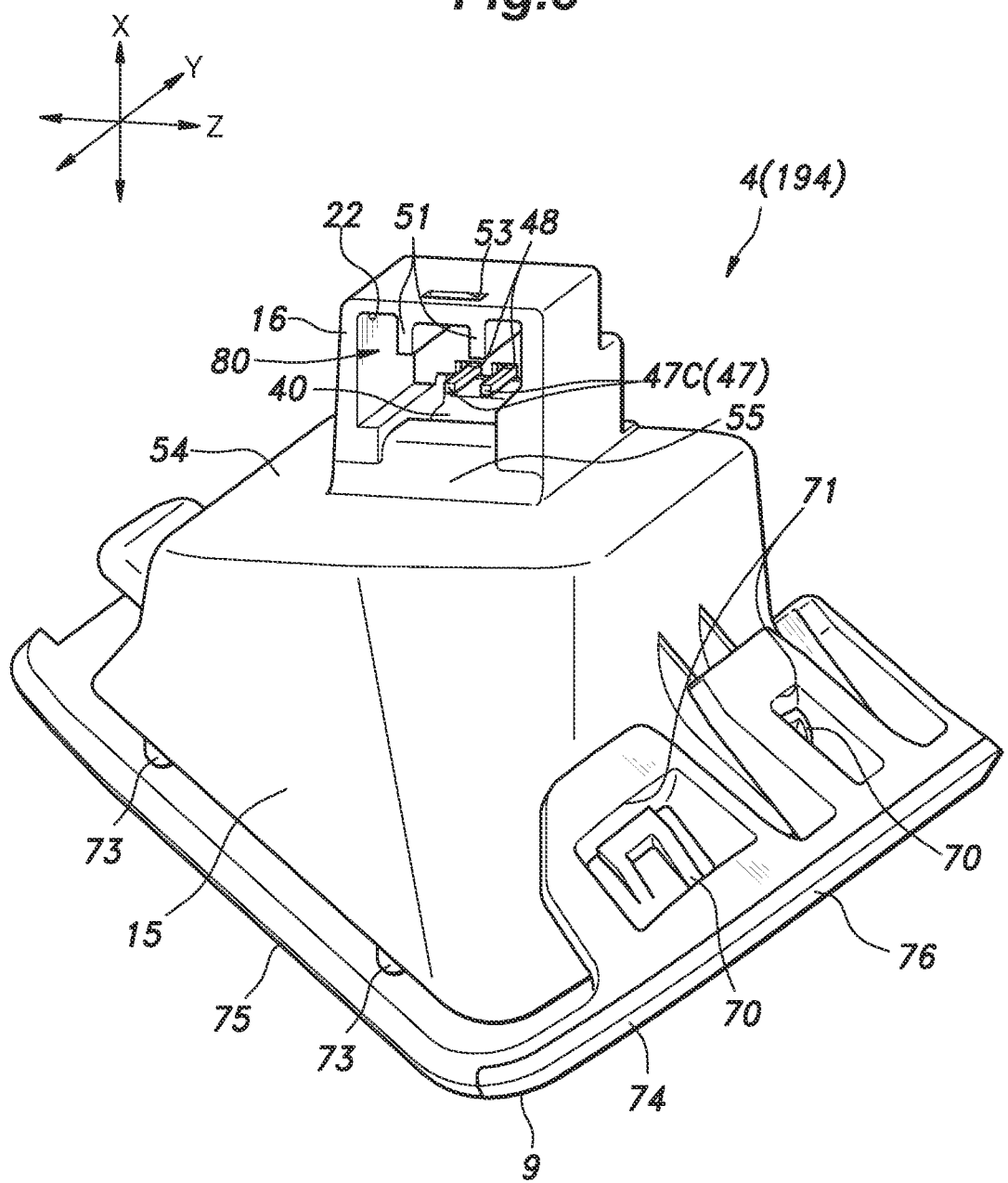
FIG. 3 is a perspective view of the lamp unit as viewed from the upper left side.
Figure 6:
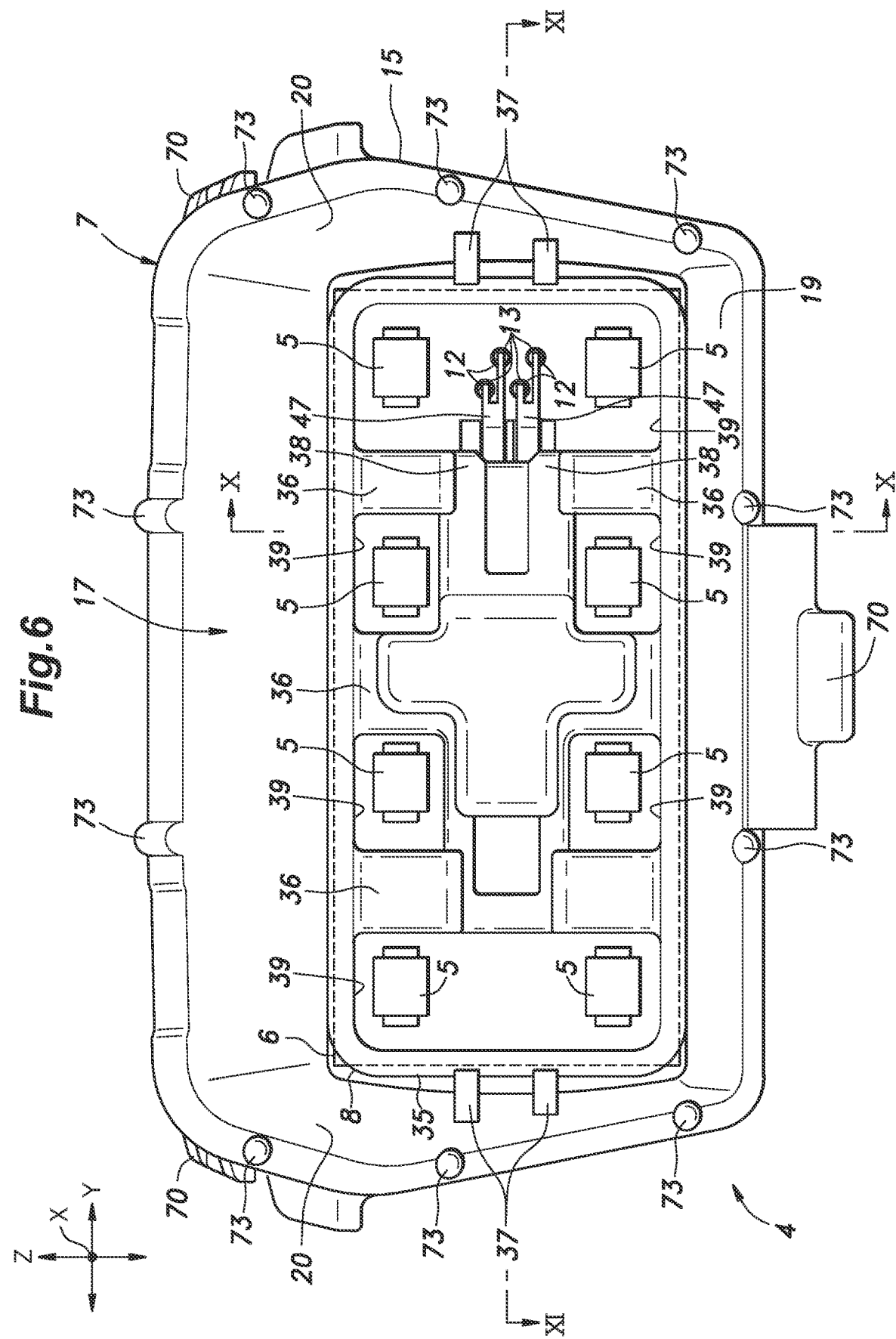
FIG. 6 is a side view of the lamp unit with the cover member removed.

As shown in FIG. 1, a vehicle door 1 for a driver's seat includes a door panel 2 serving as a skeleton, and a door trim 3 attached to an inner side of the door panel 2 as an upholstery member. A courtesy lamp 4 is attached to a lower end of the door trim 3. As shown in FIGS. 2, 3, and 6, the courtesy lamp 4 includes a base board 6 on which light-emitting elements 5 are provided, a holder member 7 supporting the base board 6, a retaining member 8 fixing the base board 6 to the holder member 7, and a cover member 9 covering the base board 6 and the retaining member 8.

Figure 7:
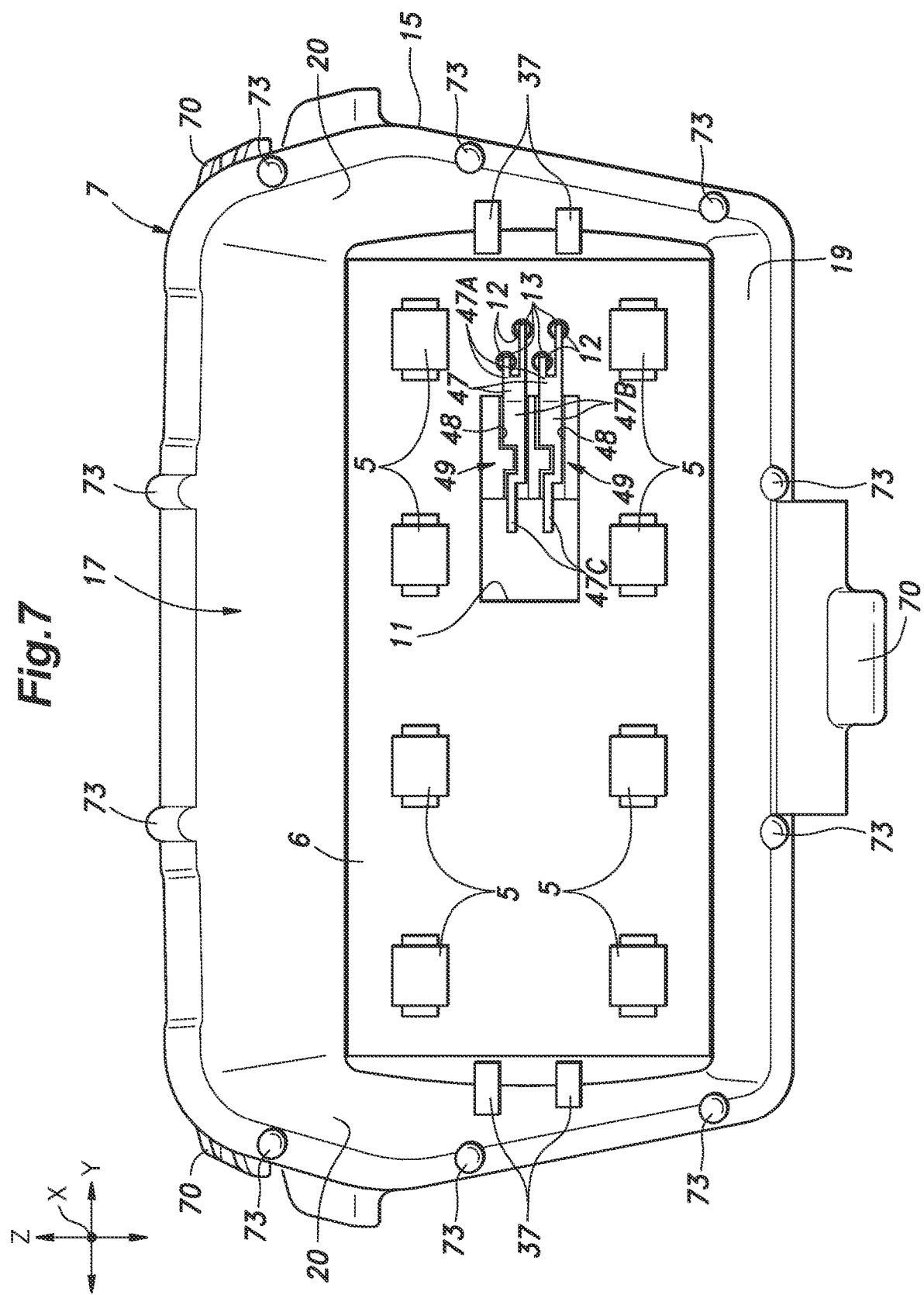
FIG. 7 is a side view of the lamp unit with the cover member and a retaining member removed.

The base board 6 is a printed circuit board on which the light-emitting elements are provided. As shown in FIG. 7, the base board 6 has a substantially rectangular shape in plan view. The light-emitting elements 5 are soldered onto a front surface of the base board 6. The light-emitting elements 5 may be, for example, surface mount type LED elements, organic EL elements, light bulbs, etc., and preferably emit white light. The base board 6 is provided with multiple light-emitting elements 5 thereon. The light-emitting elements 5 are arranged in a grid pattern on the base board 6. In the present embodiment, the light-emitting elements 5 are arranged in a grid pattern having two rows in a short-side direction and four columns in a long-side direction. In addition to the light-emitting elements 5, the base board 6 is provided with resistors, diodes, etc. (not shown) that are necessary for controlling electric power supply to the light-emitting elements 5.

As shown in FIG. 7, the base board 6 is formed with a through-hole 11 at an approximate center thereof such that the through-hole 11 extends therethrough from the front surface to the back surface. The through-hole 11 is formed to have a substantially rectangular shape and extends along the long-side direction of the base board 6. The base board 6 is further formed with four connection holes 12 that extend therethrough from the front surface to the back surface. The front surface of the base board 6 is provided with lands 13 for soldering at parts thereof surrounding the openings of the respective connection holes 12, respectively. The connection holes 12 are formed adjacent to the through-hole 11 in the long-side direction of the base board 6. In the present embodiment, the connection holes 12 each open out in the front and rear surfaces of the base board 6 to have a circular opening.

Figure 11:
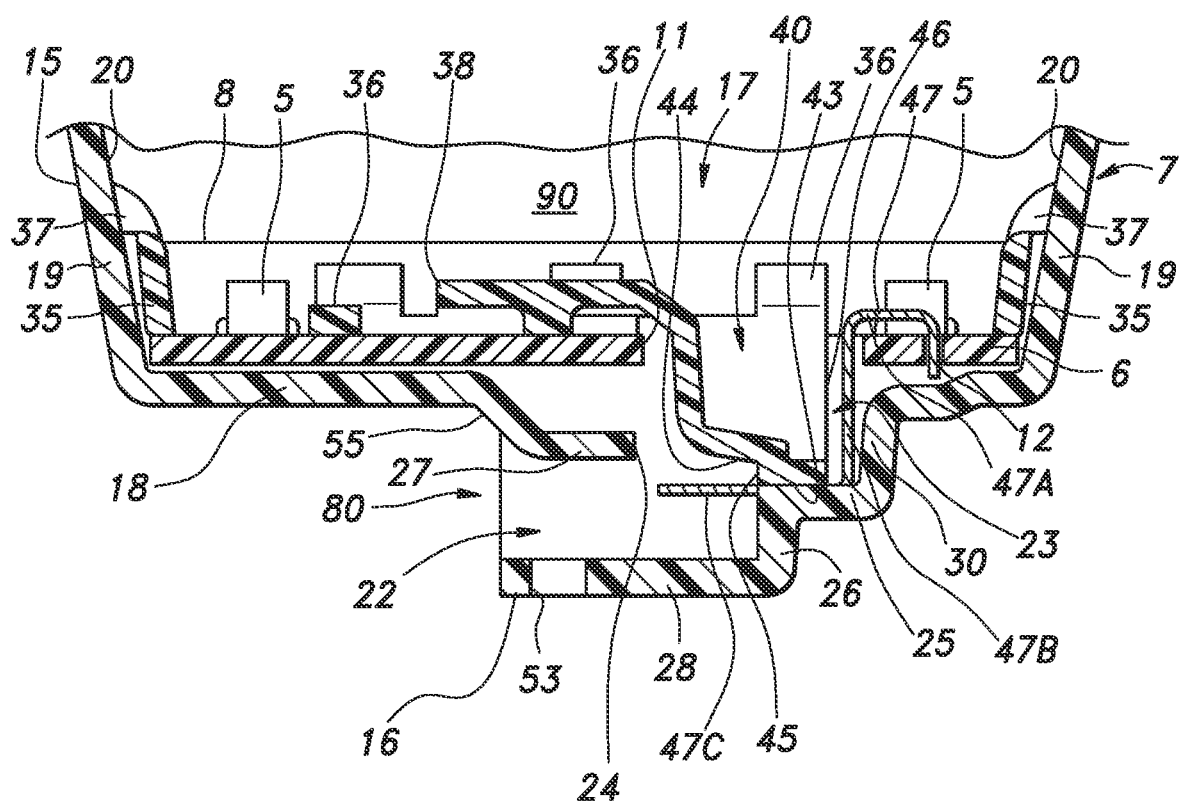
FIG. 11 is a sectional view taken along line XI-XI in FIG. 6.

The holder member 7 is a member made of resin. As shown in FIGS. 2 and 11, the holder member 7 includes a housing part 15 and a connector part 16 protruding from the housing part 15 in an X-direction, which is a prescribed direction. The housing part 15 is formed with a housing recess 17 that is recessed in the X-direction on a side thereof opposite to the side coupled with the connector part 16. The housing recess 17 is defined by a housing recess bottom wall 18 perpendicular to the X-direction and a housing recess sidewall 19 provided along a circumference of the housing recess bottom wall 18.

Figure 8:
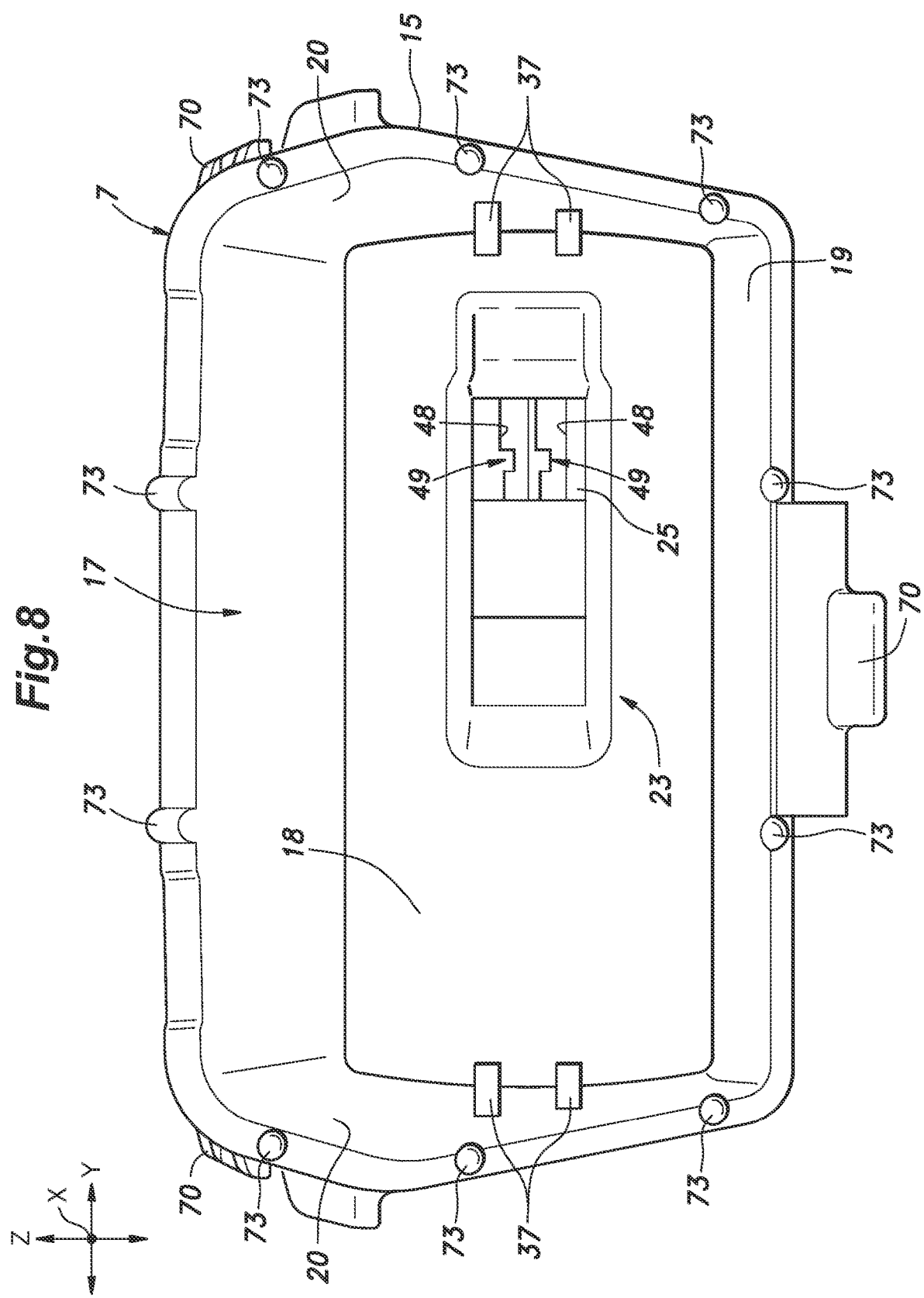
FIG. 8 is a side view of a holder member.

As shown in FIG. 8, the housing recess bottom wall 18 has a substantially rectangular shape. In the following description, the direction along the long sides of the housing recess bottom wall 18 will be referred to as a Y-direction, and the direction along the short sides of the same will be referred to as a Z-direction. The housing recess sidewall 19 includes a pair of housing recess lateral walls 20 respectively connected to the short sides of the housing recess bottom wall 18 and facing each other.

As shown in FIG. 11, the connector part 16 is formed with an insertion recess 22 that is recessed in the Y-direction. The housing recess bottom wall 18 is formed with a locking recess 23 that is recessed in the X-direction. As viewed in the Z-direction, the locking recess 23 and the insertion recess 22 partly overlap each other in the X-direction and the Y-direction. An opening 24 is formed at the overlapping part of the locking recess 23 and the insertion recess 22. The locking recess 23 and the insertion recess 22 are connected to each other via the opening 24. A locking recess bottom wall 25, which is a bottom wall of the locking recess 23, is positioned at an approximate center of the insertion recess 22 in the X-direction. An insertion recess bottom wall 26, which is a bottom wall of the insertion recess 22, is positioned at an approximate center of the locking recess 23 in the Y-direction. The locking recess bottom wall 25 and the insertion recess bottom wall 26 are connected to each other.

Figure 10:
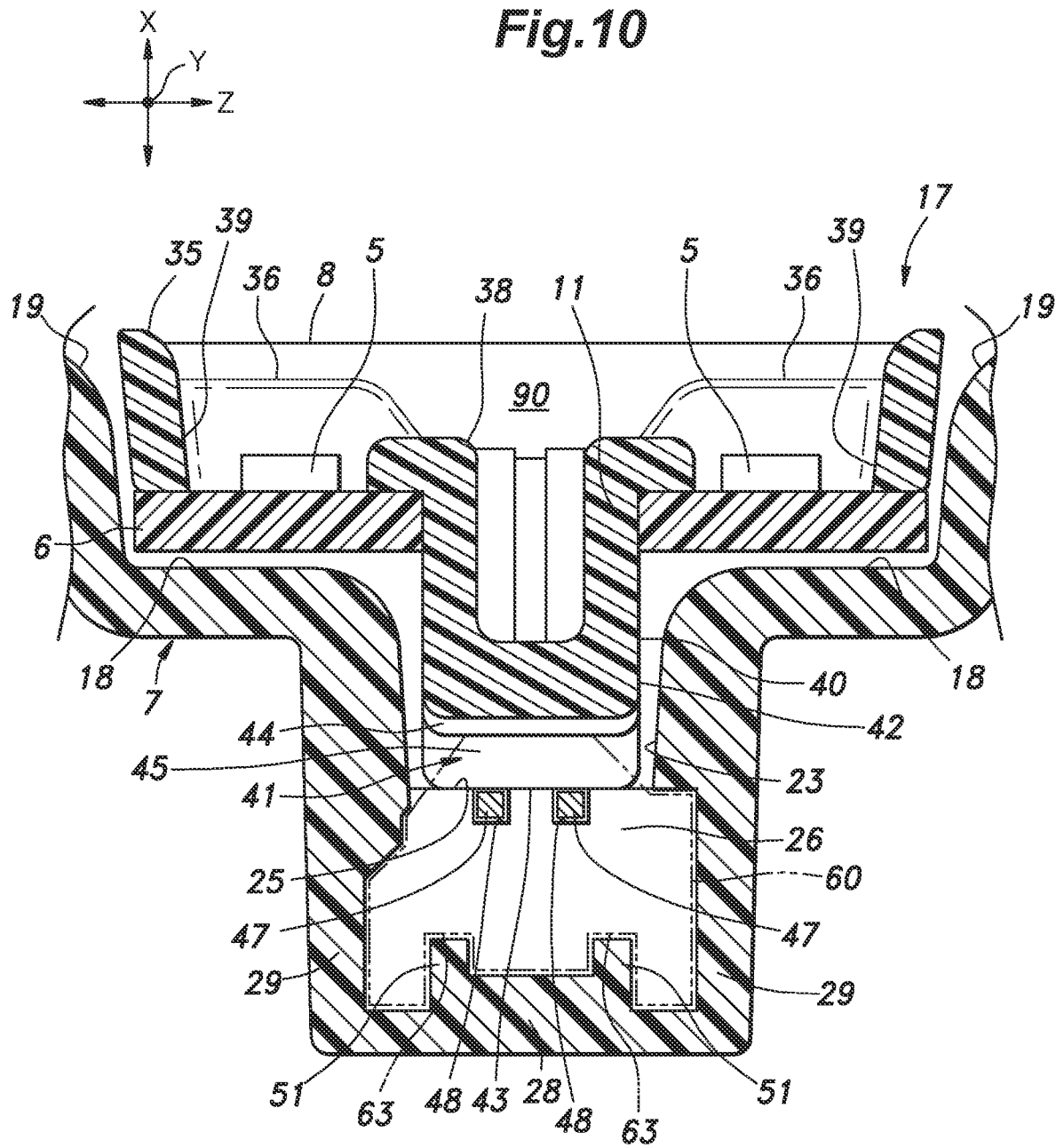
FIG. 10 is a sectional view taken along line X-X in FIG. 6.

The sidewalls defining the insertion recess 22 include a first insertion recess lateral wall 27 and a second insertion recess lateral wall 28 that face each other and a pair of insertion recess longitudinal walls 29 that face each other. The first insertion recess lateral wall 27 and the second insertion recess lateral wall 28 face in the X-direction. The first insertion recess lateral wall 27 is positioned on the side of the locking recess 23 relative to the second insertion recess lateral wall 28. As shown in FIG. 10, the insertion recess longitudinal walls 29 each face in the Z-direction.

As shown in FIG. 11, the sidewalls defining the locking recess 23 include a locking recess longitudinal wall 30 extending perpendicularly in the Y-direction and facing toward the opening of the insertion recess 22.

Figure 9:
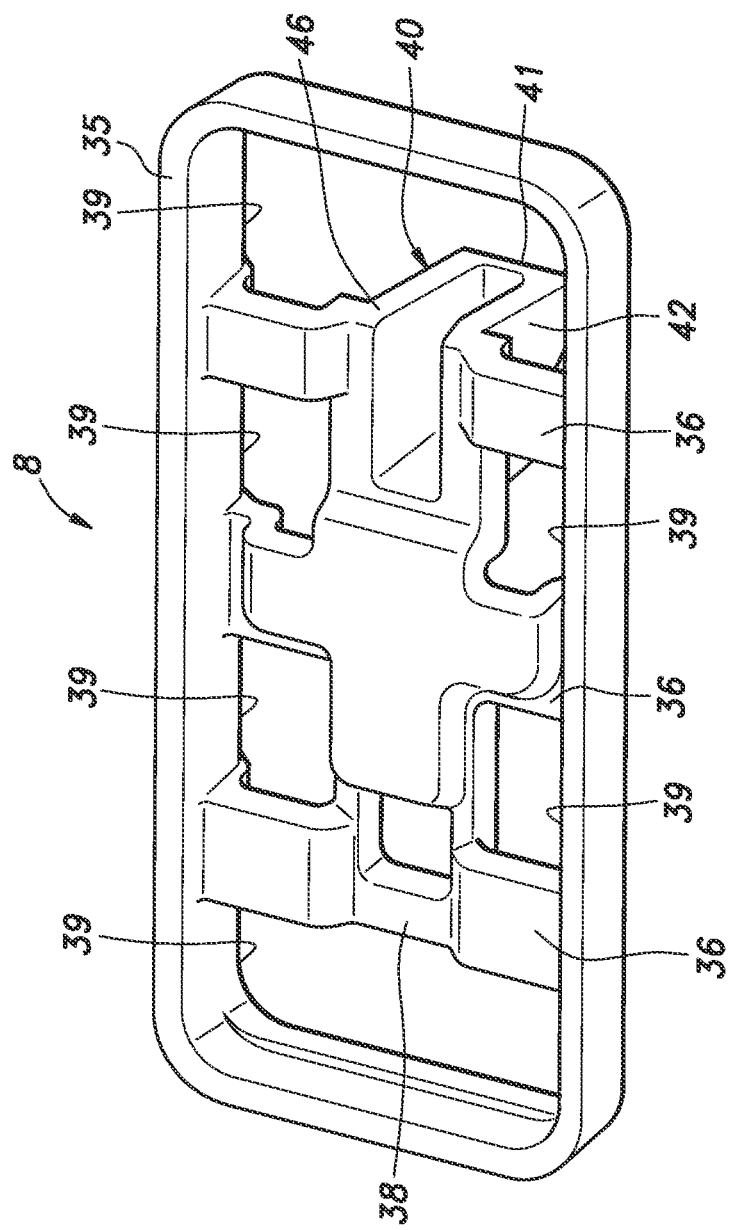
FIG. 9 is a perspective view of the retaining member.

As shown in FIG. 7, the base board 6 is housed in the housing recess 17 such that the main surface thereof faces in the X-direction. The back surface of the base board 6 is in contact with the housing recess bottom wall 18. As shown in FIG. 6, the retaining member 8 is disposed on the front side of the base board 6. The retaining member 8 is a member made of resin and having flexibility. As shown in FIG. 9, the retaining member 8 includes an outer frame 35 having a substantially rectangular shape and multiple vertical beams 36 provided between portions of the outer frame 35. The outer frame 35 is formed to have a substantially same shape as the edge portion of the base board 6.

The retaining member 8 is disposed such that the portions (long sides) of the outer frame 35 extending in the long-side direction extend along the long sides of the base board 6 and the portions (short sides) of the outer frame 35 extending in a direction perpendicular to the long-side direction extend along the short sides of the base board 6. The vertical beams 36 extend in the direction perpendicular to the long-side direction of the outer frame 35. Each of the vertical beams 36 connects the portions of the outer frame 35 extending in the long-side direction. In the present embodiment, the retaining member 8 is provided with three vertical beams 36. The retaining member 8 is in contact with the base board 6 at surfaces (back surfaces) of the outer frame 35 and the vertical beams 36 facing the base board 6.

As shown in FIG. 6, each of the housing recess lateral walls 20 is provided with locking projections 37 that protrude toward the interior of the housing recess 17. Each housing recess lateral wall 20 is provided with a pair of locking projections 37. The pair of locking projections 37 are formed on each housing recess lateral wall 20 to be disposed side by side and substantially in parallel with the housing recess bottom wall 18. The locking projections 37 abut on the front surfaces of the short sides of the outer frame 35 and restrict the movement of the retaining member 8 toward the opening of the housing recess 17. Thereby, the base board 6 is sandwiched by the housing recess bottom wall 18 and the retaining member 8. The distance between the locking projections 37 facing each other in the Y-direction is shorter than the long side of the outer frame 35 and longer than the long side of the base board 6.

The retaining member 8 is provided with a horizontal beam 38 that connects approximate centers of the multiple vertical beams 36. In the present embodiment, the horizontal beam 38 connects all of the three vertical beams 36. The vertical beams 36 and the horizontal beam 38 extend between the light-emitting elements 5 arranged in a grid pattern. The retaining member 8 is formed with light passing holes 39 that extend therethrough in the X-direction, where the light passing holes 39 are defined at positions corresponding to the light-emitting elements 5 by cooperation of the outer frame 35, the vertical beams 36, and the horizontal beam 38. As shown in FIG. 11, the horizontal beam 38 is provided with a locking protrusion 40 that protrudes from the back surface in the X-direction.

The locking protrusion 40 extends through the through-hole 11 and protrudes into the locking recess 23 to be fitted into the same. Because the locking protrusion 40 extends through the through-hole 11, the movement of the base board 6 relative to the retaining member 8 in the direction perpendicular to the protruding direction of the locking protrusion 40 is restricted. Because the locking protrusion 40 is fitted into the locking recess 23, the movement of the retaining member relative to the holder member 7 in the direction along the housing recess bottom wall 18 (X-direction and Y-direction) is restricted.

The locking protrusion 40 is constituted of a locking protrusion end wall 41 facing in the X-direction and a locking protrusion sidewall 42 coupled to the periphery of the locking protrusion end wall 41. The locking protrusion end wall 41 includes a first protruding end surface 43 and a second protruding end surface 44 formed to be displaced from each other and facing substantially in the X-direction, and a connecting surface 45 connecting the first protruding end surface 43 and the second protruding end surface 44 to each other. The first protruding end surface 43 is positioned on the base end side of the locking protrusion 40 than the second protruding end surface 44. The first protruding end surface 43 forms a surface facing the locking recess bottom wall 25, and the second protruding end surface 44 is provided at a position that faces the second insertion recess lateral wall 28 via the opening 24. The connecting surface 45 faces in the Y-direction toward the opening of the insertion recess 22, and is continuous with the wall surface of the insertion recess bottom wall 26. The locking protrusion 40 is in contact with the locking recess bottom wall 25 at the first protruding end surface 43. The locking protrusion sidewall 42 includes a locking protrusion longitudinal wall 46 that faces the locking recess longitudinal wall 30.

Multiple metallic connection terminals 47 each formed in a leaf spring-like shape are attached to the base board 6. As shown in FIGS. 6 and 7, in the present embodiment, two connection terminals 47 are attached to the base board 6. The connection terminals 47 are coupled to the base board 6 at base end portions thereof.

As shown in FIGS. 7 and 11, each connection terminal 47 includes, from the base end side thereof, a base end portion 47A, an intermediate portion 47B, and a protruding end portion 47C. A part of the base end portion 47A on the base end side is bifurcated into two branches, each being inserted into the corresponding connection hole 12 and soldered onto the corresponding land 13. The base end portion 47A extends from the connection holes 12 toward the through-hole 11. A part of the base end portion 47A on the protruding end side is bent in the X-direction and extends into the through-hole 11 to be connected with the intermediate portion 47B. The intermediate portion 47B extends along the through-hole 11 to the back side of the base board 6, and then passes between the locking protrusion longitudinal wall 46 and the locking recess longitudinal wall 30 to reach the locking recess bottom wall 25. The intermediate portion 47B is bent at the locking recess bottom wall 25 and is connected to the protruding end portion 47C. The protruding end portion 47C extends in the Y-direction along the locking recess bottom wall 25 (see FIG. 10). The locking recess bottom wall is formed with multiple grooves 48 extending in the direction from the locking recess longitudinal wall 30 toward the opening of the insertion recess 22 (Y-direction). In the present embodiment, the locking recess bottom wall 25 is formed with two grooves 48. The part of the protruding end portion 47C adjacent to the intermediate portion 47B is received in the corresponding groove 48, and as shown in FIGS. 10 and 11, the part of the protruding end portion 47C adjacent to the intermediate portion 47B is sandwiched between the locking recess bottom wall 25 and the first protruding end surface 43.

As shown in FIG. 8, a substantially middle part of each groove 48 in the Y-direction is formed with a narrow section 49 having a width narrowed in the Z-direction. The width of the part of the protruding end portion 47C corresponding to the narrow section 49 is narrowed in the Z-direction. When the connection terminal 47 is moved along the Y-direction, the protruding end portion 47C abuts against the wall surface defining the narrow section 49. Thus, the narrow section 49 restricts the movement of the connection terminal 47 in the Y-direction.

The protruding end portion 47C extends in the groove 48 in the Y-direction, and protrudes toward the opening of the insertion recess 22. The protruding end portion 47C protrudes substantially perpendicularly relative to the insertion recess bottom wall 26 and reaches between the second protruding end surface 44 and the second insertion recess lateral wall 28. The second protruding end surface 44 is positioned on the base end side than the first protruding end surface 43, and therefore, the second protruding end surface 44 is spaced from the locking recess bottom wall 25 in the X-direction. As a result, a gap is created between the second protruding end surface 44 and the connection terminal 47, and the protruding end of the protruding end portion 47C protrudes from between the connecting surface 45 and the wall surface of the insertion recess bottom wall 26 which are continuous with each other. The second protruding end surface 44 is inclined such that the distance to the second insertion recess lateral wall 28 increases toward the opening of the insertion recess 22.

The second insertion recess lateral wall 28 is formed with a pair of ridges 51 each extending in the Y-direction and a locking hole 53 passed therethrough in the X-direction. A part of the outer surface of the housing part 15 that is continuous with the opening of the connector insertion recess 22 is formed with an inclined surface 55 that is connected to the opening. The inclined surface 55 is inclined in such a direction that the inclined surface 55 approaches the axis of the connector insertion recess 22 as it approaches from the connector insertion recess 22 along the Y-direction.

Figure 4:
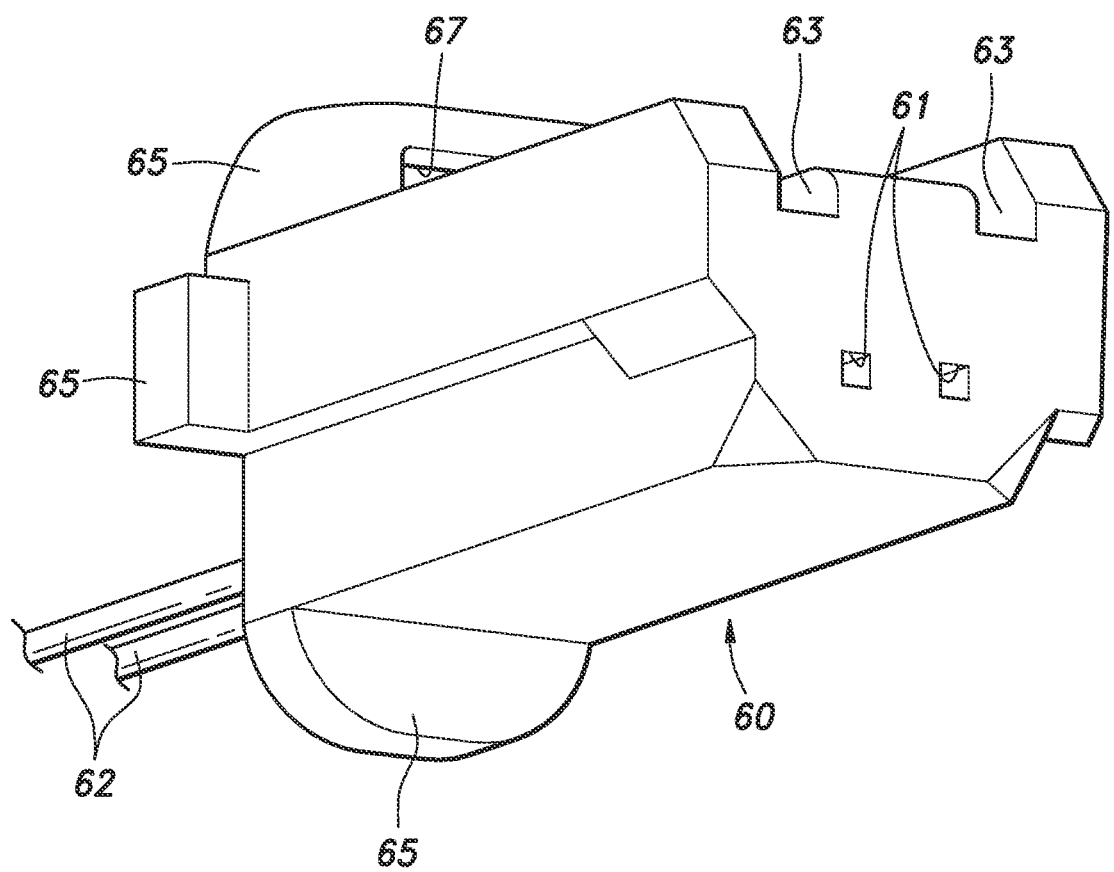
FIG. 4 is a perspective view of a connector to be connected to the lamp unit.

As shown in FIG. 4, a connector 60 has an insertion end formed with a pair of terminal receiving holes 61 in which the connection terminals 47 are inserted, and a cable 62 extending outward from a rear surface of the connector 60 with respect to the insertion direction. The cable 62 extends along the door panel 2 to the vehicle body and is connected to a control unit (not shown in the drawings) mounted on the vehicle body. A side surface of the connector 60 is formed with a pair of guide grooves 63 each extending in the extension direction. The connector 60 is provided with locking walls 65 protruding from the respective side surfaces. One locking wall 65 is provided with a locking claw 67 for engaging the locking hole 53.

A connector insertion hole 80 is defined by the second protruding end surface 44, the connecting surface 45, and the insertion recess 22. When the connector 60 is inserted into the connector insertion hole 80, the front end of the connector 60 contacts the inclined surface 55 and moves along the inclined surface 55 to be guided into the insertion recess 22. As the connector 60 is inserted further, the front end of the connector 60 contacts the second protruding end surface 44, and moves along the second protruding end surface 44. Thereby, the connector 60 is guided to a proper position where the connection terminals 47 are inserted in the terminal receiving holes 61. The ridges 51 engage the guide grooves 63, and the connector 60 is guided to the proper position. By making the locking claw 67 engage the locking hole 53, the connector 60 is coupled to the courtesy lamp 4. At this time, as shown in FIG. 10, the connector 60 is sandwiched by the second protruding end surface 44 and the second insertion recess lateral wall 28. Also, the connector 60 is connected to the base board 6 via the connection terminals 47.

As shown in FIGS. 2 and 3, the outer surface of the housing part 15 is provided with multiple locking claws 70 along an opening edge of the housing recess 17. As shown in FIG. 4, the cover member 9 is a plate-like member made of a light-transmissive resin. The cover member 9 is formed with engagement holes 71 in an edge portion thereof. The cover member 9 is coupled to the opening of the housing recess 17 with the locking claws 70 engaging the engagement holes 71. As shown in FIG. 2, the opening of the housing recess 17 is closed by the cover member 9. The housing recess 17 and the cover member 9 define a housing chamber 90 for housing the base board 6 and the retaining member 8.

As shown in FIGS. 6, 7, and 8, the opening edge of the housing recess 17 is formed with multiple projections 73 protruding in the opening direction. As shown in FIG. 3, the cover member 9 abuts on the projections 73 such that a gap is formed between the cover member 9 and the opening edge of the housing recess 17. The heat generated from the light-emitting elements 5 can be released to the outside of the housing recess 17 through the gap.

Figure 5:
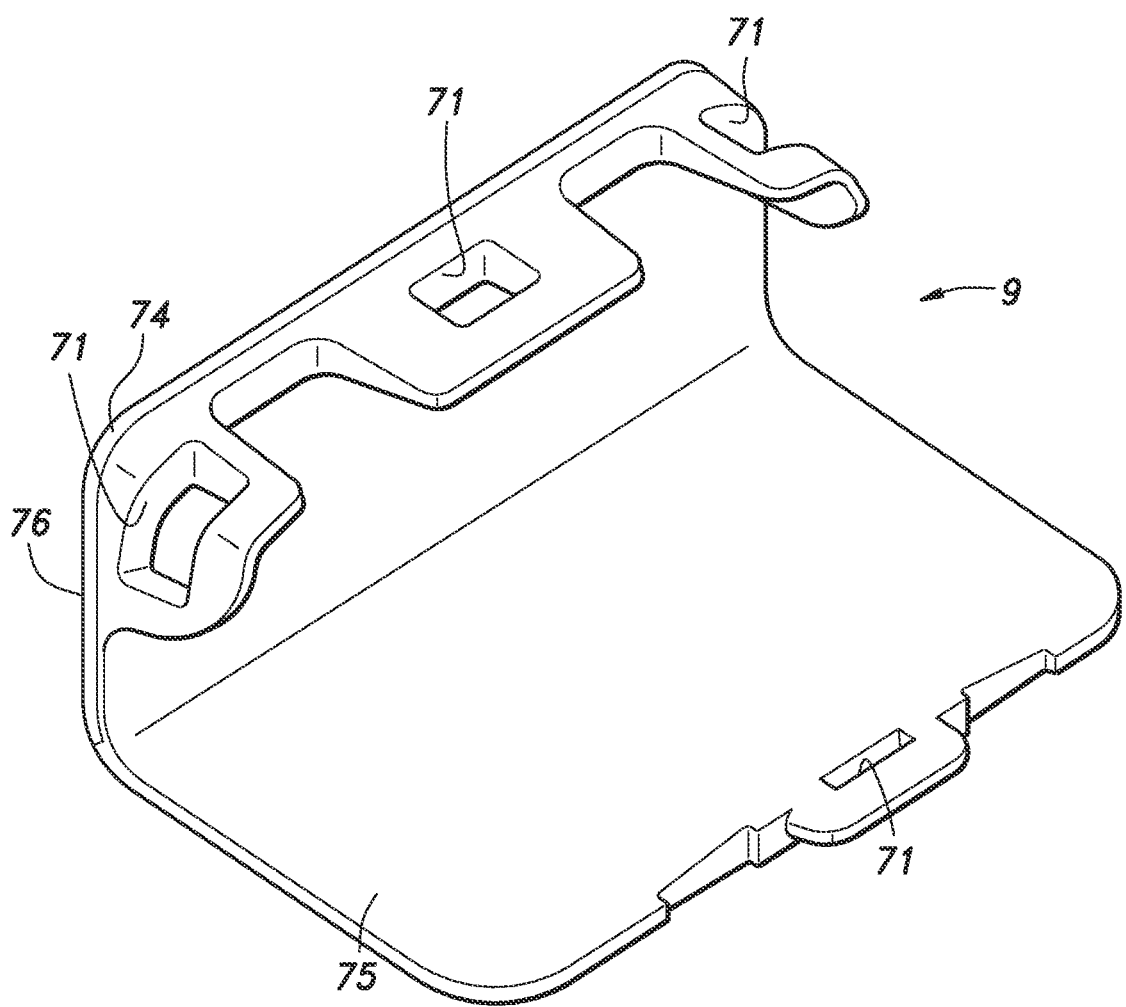
FIG. 5 is a perspective view of a cover member.

The cover member 9 is made of a transparent resin and, as shown in FIGS. 2 and 5, includes a cover sidewall 74 and a cover lower wall 75 connected to the cover sidewall 74 substantially perpendicularly. The cover sidewall 74 and the cover lower wall 75 each have a substantially rectangular shape. As shown in FIG. 1, when the courtesy lamp 4 is attached to the door trim 3, the cover sidewall 74 is disposed to be continuous with the side surface of the door trim 3. The cover lower wall 75 is disposed to be continuous with the lower surface of the door trim 3. A colored member 76 which is red and transparent is attached to the cover sidewall 74.

The courtesy lamp 4 is fixed to the door trim 3, which serves as an attachment object, by using predetermined members such as screws. The connector 60 is connected to the courtesy lamp 4. The door trim 3 is fixed to the door panel 2 by using predetermined bolts. When the vehicle door 1 is closed, the X-direction is directed obliquely upward and outward of the vehicle, while the Y-direction is directed in the fore and aft direction of the vehicle body.

When the vehicle door 1 is open, the light-emitting elements 5 emit light. When the light-emitting elements 5 emit light, the courtesy lamp 4 lights up in red at the cover sidewall 74 to warn the vehicles coming from behind that the vehicle door 1 is open. When the light-emitting elements 5 emit light, the courtesy lamp 4 lights up in white at the cover lower wall 75 to illuminate the foot area of the vehicle occupant getting in or out of the vehicle.

Next, effects of the courtesy lamp 4 with the above-described structure will be described. The light-emitting elements 5 are connected to the base board 6, and the base board 6 is sandwiched between the retaining member 8 and the housing recess bottom wall 18. Therefore, rattling of the light-emitting elements 5 is prevented.

Further, the retaining member 8 and the base board 6 are covered by the cover member 9. In addition, the retaining member 8 and the base board 6 are housed in the housing recess 17. The cover member 9 closes the opening of the housing recess 17. Owing to these features, even when a load is applied to the courtesy lamp 4, the load does not directly act on the retaining member 8 and the base board 6, and damage to the retaining member 8 and the base board 6 can be prevented.

Because the base board 6 is sandwiched between the retaining member 8 and the holder member 7, the attachment thereof does not need screws or the like, and thus the attachment is easy. Further, because the base board 6 is disposed along the housing recess bottom wall 18, a load that would break the base board 6 is not likely to be applied, and damage to and movement of the base board 6 can be prevented.

Owing to the light passing holes 39, the light from the light-emitting elements 5 reaches the opening of the housing recess 17 without being obstructed by the retaining member 8. Further, because the retaining member 8 is formed with the light passing holes 39, the retaining member 8 has a lighter weight than when formed in a plate-like shape. In addition, because the horizontal beam 38 connects the vertical beams 36 and is not coupled to the outer frame 35, the outer frame 35 is easy to bend in the Y-direction, and the assembly of the retaining member 8 is easy. Because the long side of the base board 6 is shorter than the distance between the locking projections 37 facing each other in the Y-direction, the base board 6 can be passed between the locking projections 37 facing each other in the Y-direction, and thus, the assembly of the base board 6 is easy.

Because the connection terminals 47 are sandwiched between the locking recess bottom wall 25 and the first protruding end surface 43, the movement of the connection terminals 47 relative to the holder member 7 can be prevented. There is no need to fix the connection terminals 47 to the holder member 7 by using adhesive or the like, and thus, the assembly is easy.

The protruding end portion 47C protrude from the connecting surface 45 and the insertion recess bottom wall 26. As a result, the connection terminals 47 protrude from an approximate center of the bottom wall of the connector insertion hole 80. Therefore, the connection terminals 47 can be fitted into the terminal receiving holes 61 of the connector 60.

Second Embodiment

A courtesy lamp 94 of the second embodiment differs from the courtesy lamp 4 of the first embodiment with regard to the shape of the retaining member 8 and the holder member 7. The other features are the same as those of the courtesy lamp 4 of the first embodiment, and therefore, description thereof will be omitted.

Figure 12:
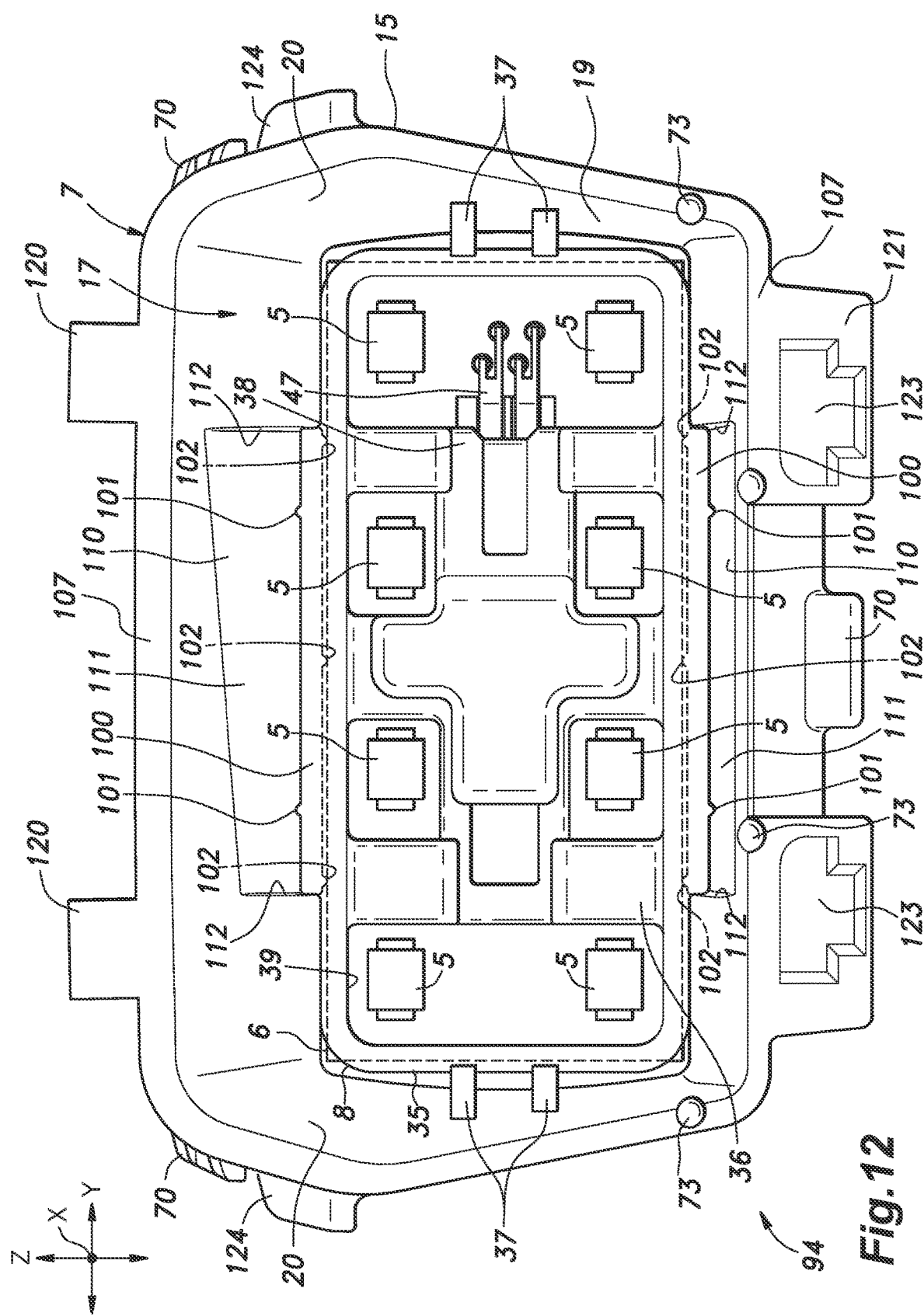
FIG. 12 is a side view of the lamp unit according to the second embodiment with the cover member removed.
Figure 14:
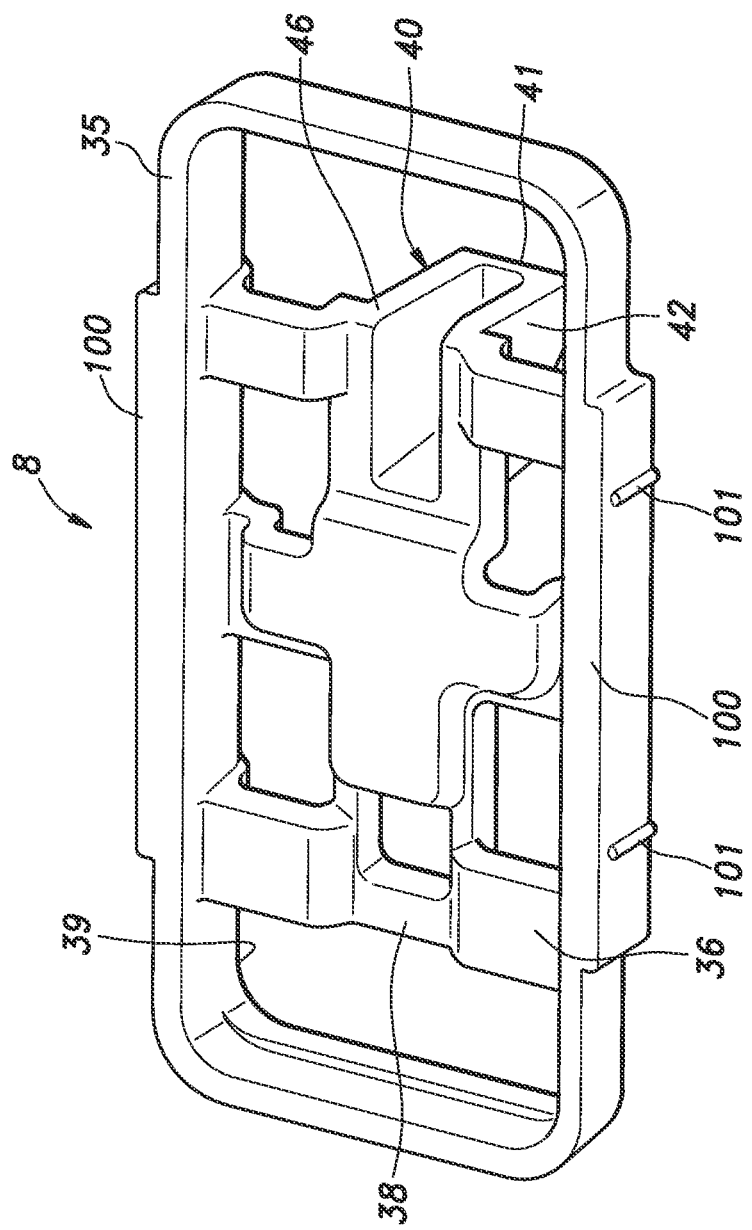
FIG. 14 is a perspective view of the retaining member regarding the second embodiment as viewed from the front side.
Figure 15:
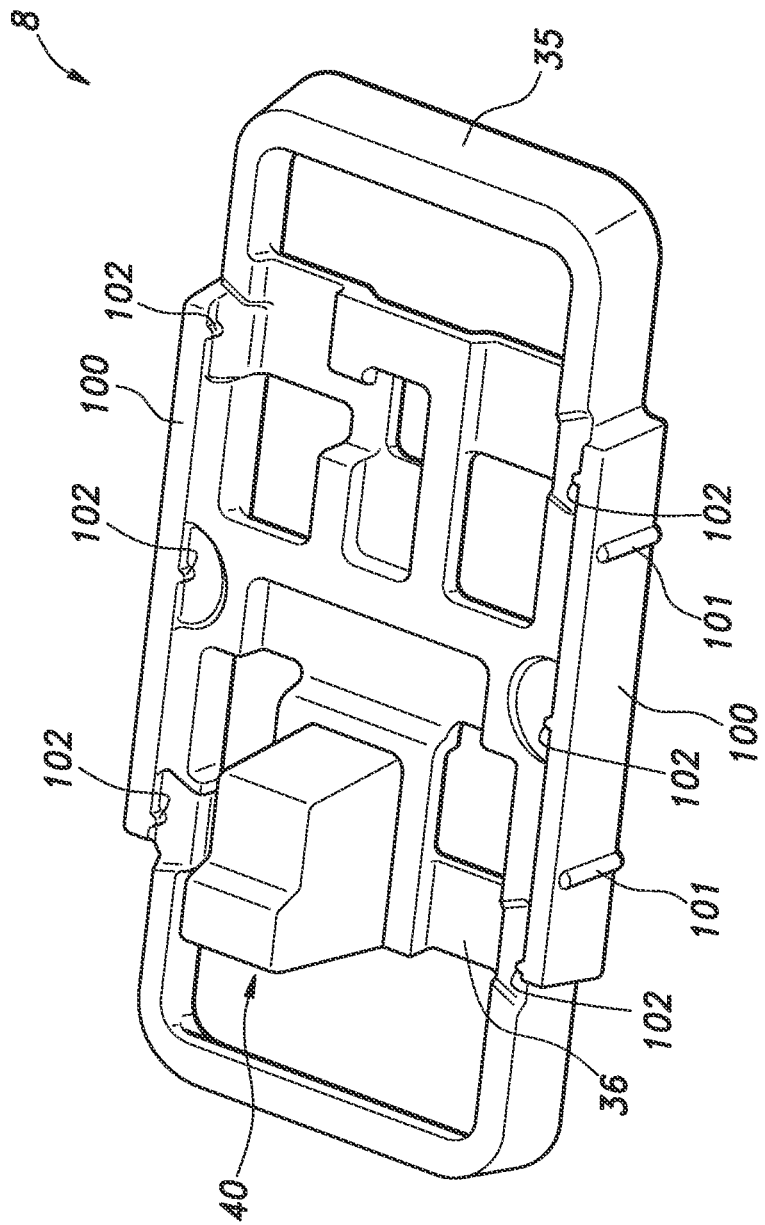
FIG. 15 is a perspective view of the retaining member regarding the second embodiment as viewed from the back side.

As shown in FIGS. 12, 14, and 15, the outer frame 35 of the retaining member 8 is provided with protruding portions 100 that protrude outwardly on portions of the outer surface thereof extending in the long-side direction. The protruding ends of the protruding portions 100 are formed with substantially rectangular surfaces that face outward and away from each other. Each of the protruding end surfaces of the protruding portions 100 is formed with multiple first projections 101 that project outward. The first projections 101 formed on one of the protruding portions 100 are provided at positions that align with the first projections 101 formed on the other of the protruding portions 100 in the short side direction (Y-direction) to form pairs. In the present embodiment, the retaining member 8 is provided with two pairs of first projections 101.

As shown in FIG. 15, the protruding portions 100 each extend in the back side direction to define an inward-facing surface. On each inward-facing surface are formed rib-like second projections 102 that project inward and extend in the back side direction or toward the base board 6. As shown in FIG. 12, the second projections 102 formed on one of the protruding portions 100 are provided at positions that align with the second projections 102 formed on the other of the protruding portions 100 in the short side direction (Y-direction) to form pairs. In the present embodiment, the retaining member 8 is provided with three pairs of second projections 102. As shown in FIG. 15, a part of the back surface of the retaining member 8 around each second projection 102 is recessed in a substantially semi-circular shape.

Figure 13:
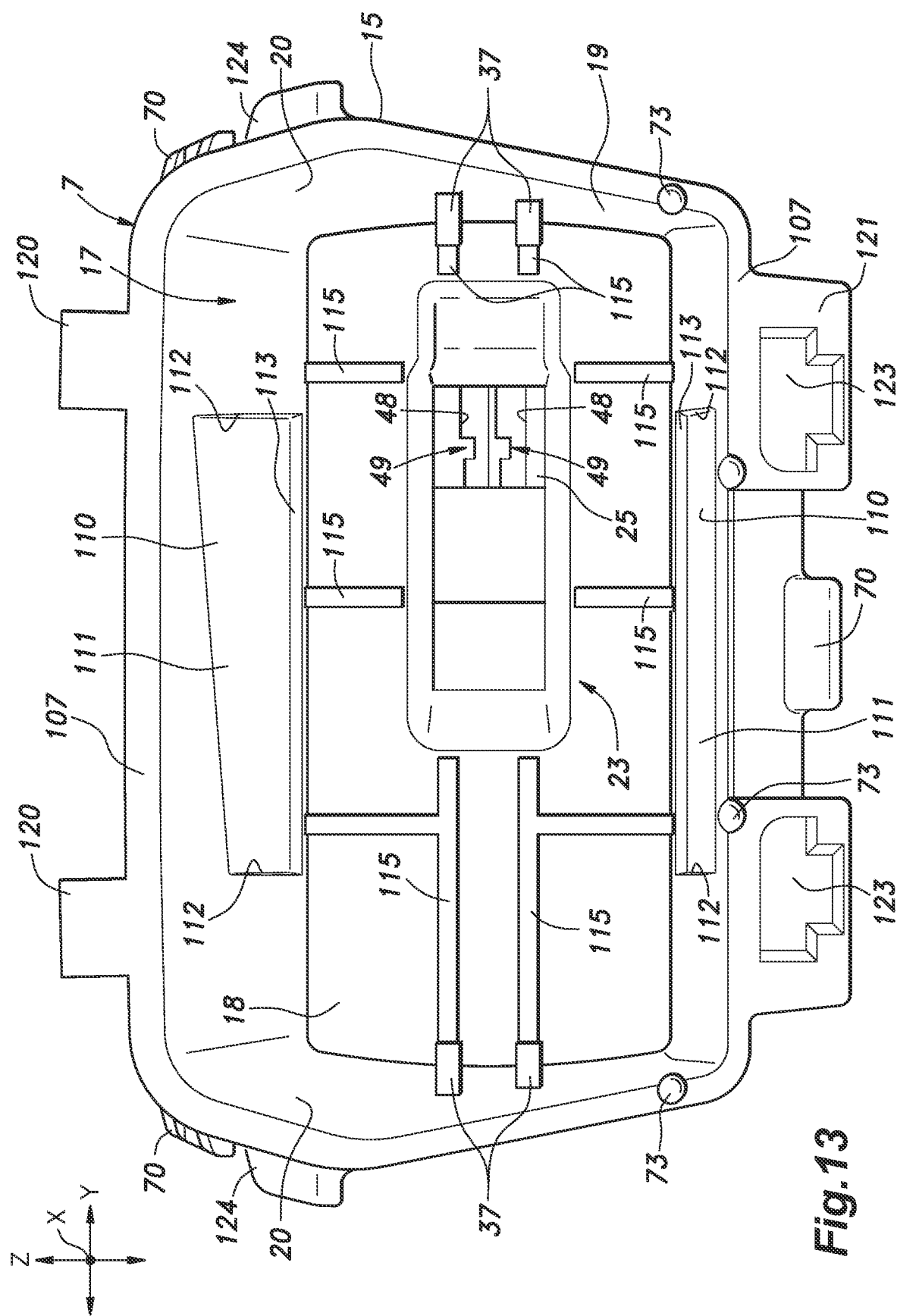
FIG. 13 is a side view of the lamp unit according to the second embodiment with the cover member and the retaining member removed.

As shown in FIG. 12, each of the inner surfaces of portions of the housing recess sidewall 19 of the holder member 7 facing in the Z-direction (hereinafter, housing recess longitudinal walls 107) is provided with a receiving recess 110 that is recessed outward. As shown in FIG. 13, the receiving recesses 110 are defined by pressed surfaces 111 that face inward of the housing recess 17 and toward each other, left and right side surfaces 112 facing in the Y-direction, and locking surfaces 113 (FIG. 13) facing in the X-direction (opening direction of the housing recess 17).

Figure 16:
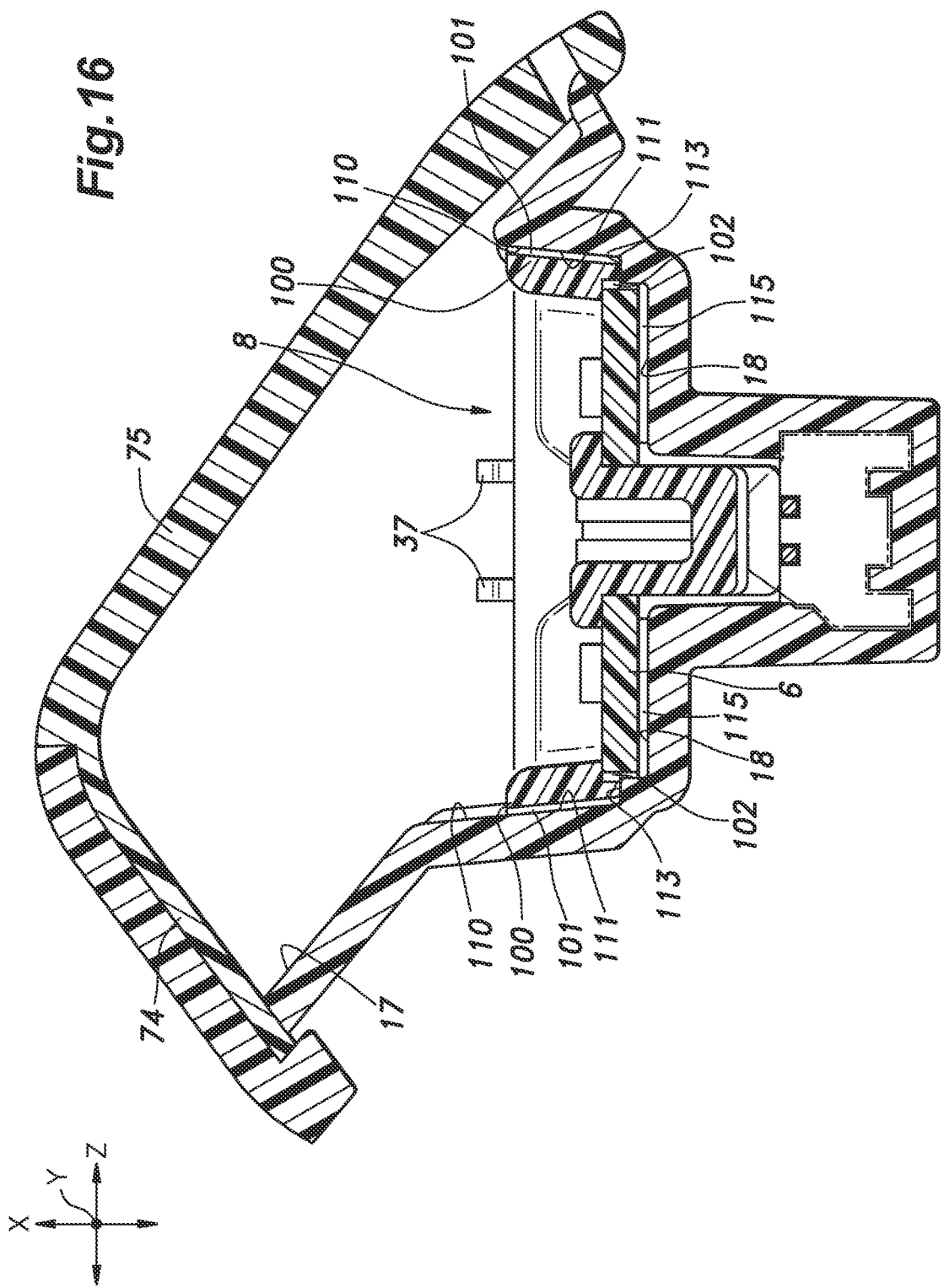
FIG. 16 is a perspective view of the lamp unit according to the second embodiment.

As shown in FIG. 16, the distance between the two pressed surfaces 111 is substantially the same as or slightly smaller than the distance between the protruding ends of the first projections 101 forming a pair. The first projections 101 are received in the receiving recesses 110 and undergo resilient deformation to press the pressed surfaces 111. Thereby, rattling of the retaining member 8 relative to the holder member 7 is prevented.

It is also possible to omit the first projections 101 and insert elastic members (rubber), pieces of non-woven fabric, or the like between the outer surface of each protruding portion 100 and the corresponding pressed surface 111, to prevent rattling of the retaining member 8 relative to the holder member 7.

Each locking surface 113 is formed at a different level in the X-direction from the housing recess bottom wall 18 and is positioned on the side of the opening of the housing recess 17 (upper side in the drawing) than the housing recess bottom wall 18. The protruding portions 100 abut against the respective locking surfaces 113 at end surfaces thereof on the back side (lower side in the drawing).

As shown in FIG. 13, the housing recess bottom wall 18 is formed with multiple ribs 115 that protrude toward the opening. The ribs 115 include horizontal ribs (two in this embodiment) extending in the Y-direction and vertical ribs (three in this embodiment) extending in the Z-direction, and are formed such that the protruding end surfaces of the all ribs 115 align with each other in the X-direction. As shown in FIG. 16, the protruding end surfaces of the ribs 115 are positioned on the side of the housing recess bottom wall 18 (lower side in the drawing) than the locking surfaces 113 in the X-direction.

The back surface of the base board 6 abuts against the protruding ends of the ribs 115, and the front surface thereof is positioned on the side of the opening of the housing recess 17 than the locking surfaces 113. Further, the second projections 102 abut against the end surfaces of the base board 6 in the Z-direction. The distance between the mutually facing surfaces of the second projections 102 forming a pair is substantially the same as or slightly smaller than the width of the base board 6 in the Z-direction. As a result, the second projections 102 each undergo elastic deformation to press the end surfaces of the base board 6, with the base board 6 being sandwiched between the second projections 102 forming a pair. Thereby, the base board 6 is coupled to the retaining member 8, and rattling of the base board 6 relative to the holder member 7 is prevented. As shown in FIG. 12, the LED elements, resistors, etc. are preferably arranged to avoid between the mutually facing second projections 102 to prevent the load applied by the second projections 102 from acting on the LED elements, resistors, or the like mounted on the base board 6.

As shown in FIG. 12, each of the housing recess lateral walls 20 is provided with the locking projections 37. Each locking projection 37 has a claw-like shape and protrudes inward of the housing recess 17 or in the Y-direction (inserting direction of the connector 60) to abut against the front surface of the retaining member 8. Thereby, the movement of the base board 6 and the retaining member 8 in the opening direction of the housing recess 17 is restricted. Further, the locking projections 37 are positioned substantially at a center between the two housing recess longitudinal walls 107 in the Z-direction. Therefore, the outer frame 35 can be bent easily at a position corresponding to the locking projections 37, and the assembly of the retaining member 8 becomes easy.

Figure 17:
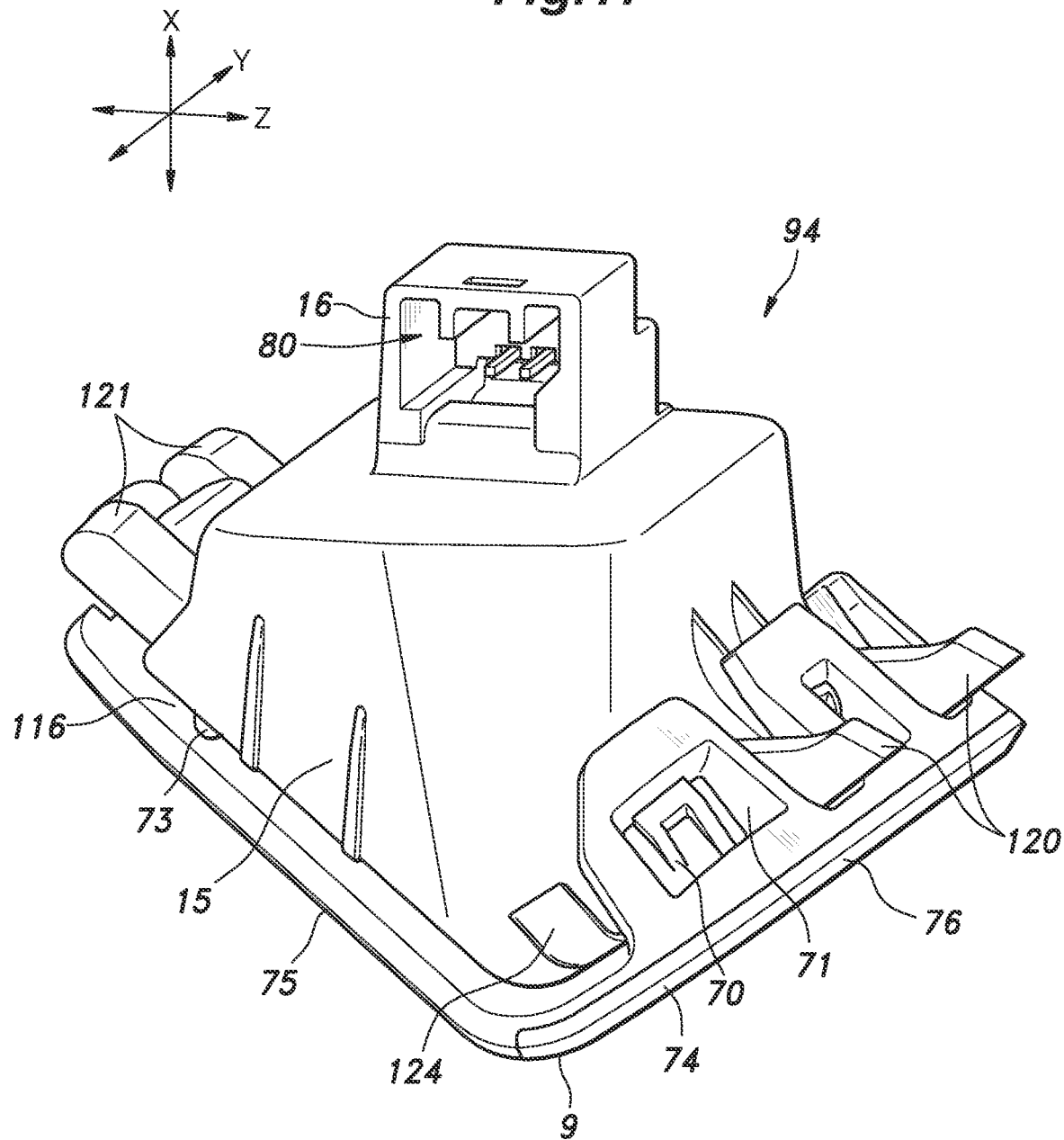
FIG. 17 is a sectional view of the lamp unit according to the second embodiment.

Similarly to the first embodiment, the cover member 9 is attached to the holder member 7. As shown in FIG. 16, in this embodiment, the cover sidewall 74 is in contact with the opening edge of the housing recess 17. Thereby, leakage of light through the interface between the cover sidewall 74 and the opening edge of the housing recess 17 is prevented. In addition, as shown in FIG. 17, the opening edge of the housing recess 17 is provided with the projections 73 similarly to those in the first embodiment are provided at positions corresponding to the cover lower wall 75. The cover lower wall 75 contacts the projections 73, and a gap 116 is formed between the cover lower wall 75 and the opening edge of the housing recess 17. The gap 116 can absorb deformation of the holder member 7 and the cover member 9, and therefore, it becomes easy to couple the holder member 7 and the cover member 9 to each other. The resin forming the cover member 9 preferably contains diffusing material for scattering light.

As shown in FIG. 12, an opening-side edge portion of one of the housing recess longitudinal walls 107 (upper side in FIG. 12) to be coupled with the cover sidewall 74 is provided with two extensions 120 arranged side by side. The extensions 120 each protrude outward of the opening of the housing recess 17 from the edge portion. An opening-side edge portion of another of the housing recess longitudinal walls 107 to be coupled with the cover lower wall 75 is provided with a flange portion 121. The flange portion 121 has a plate-like shape and extends outward of the opening of the housing recess 17. The flange portion 121 has a main surface facing in the opening direction of the housing recess 17, and the main surface is formed with multiple (two in this embodiment) flange recesses 123 each of which is recessed in the bottom direction of the housing recess 17. The outer surface of each housing recess lateral wall 20 is provided with a tongue 124 that protrudes outward.

Figure 18:
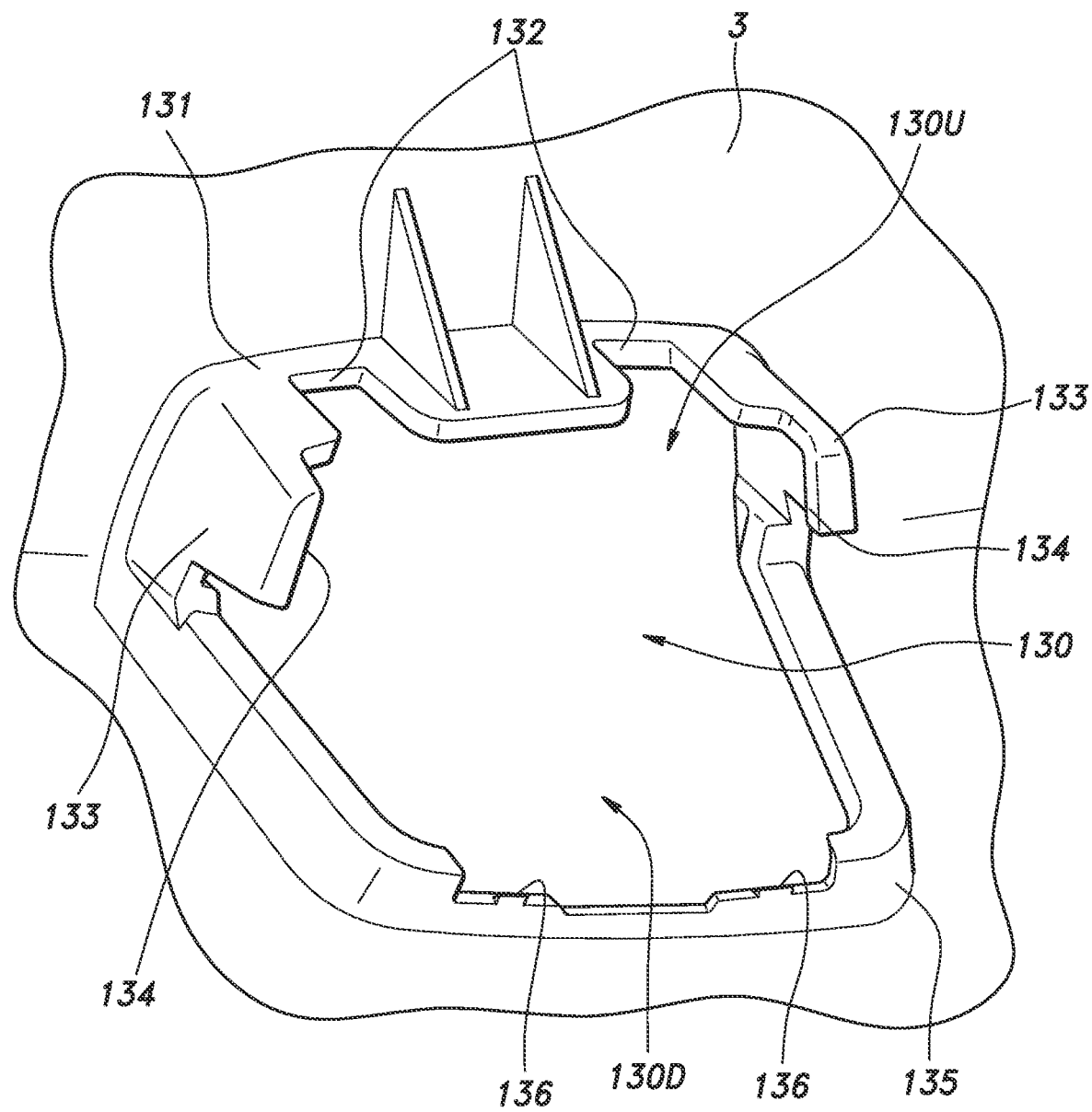
FIG. 18 is a perspective view of a door trim regarding the second embodiment.

As shown in FIG. 1, the lower edge of the door trim 3 is bent toward the outside of the vehicle. As shown in FIG. 18, the bent part is formed with a door trim opening 130 passed therethrough in a shape corresponding to the cover member 9. The door trim opening 130 is constituted of an upper part 130U provided in a wall surface of the door trim 3 facing in the vehicle width direction, and a lower part 130D provided in a wall surface extending toward the outside of the vehicle. An edge portion defining the upper part 130U is provided with an upper edge wall 131 extending in the back side direction. The upper edge wall 131 is formed with two upper edge wall recesses 132 that are recessed in the front side direction. The upper edge wall 131 is further provided with a pair of retaining plates 133 that extend in the back side direction in a plate-like shape and are spaced in the fore and aft direction. The extension end of each retaining plate 133 is provided with a claw 134 that protrudes inward of the door trim opening 130. An edge portion defining the lower part 130D is provided with a lower edge wall 135. The lower edge wall 135 is provided with multiple (two in this embodiment) edge wall projections 136 that project upward.

Figure 19:
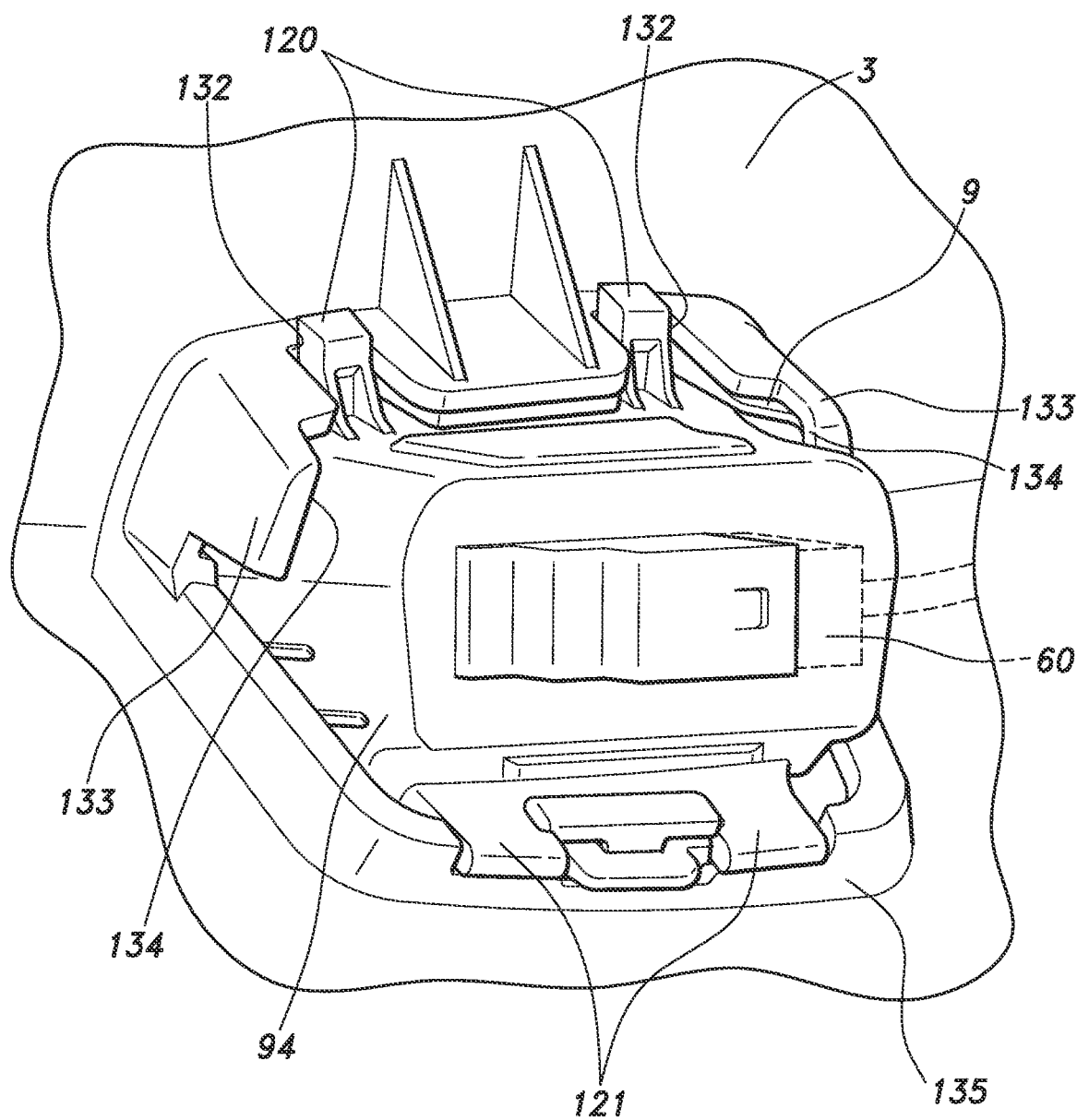
FIG. 19 is a perspective view of the door trim to which the lamp unit according to the second embodiment is attached.

As shown in FIG. 19, the courtesy lamp 94 is attached to the door trim 3. When attached, the extensions 120 are inserted in the door trim opening 130 from the front side, such that the extensions 120 respectively engage the upper edge wall recesses 132. Thereafter, the courtesy lamp 94 is rotated with the extensions 120 as an axis to push in the flange portion 121 to the back side. When the flange portion 121 is pushed in, the edge wall projections 136 elastically deform and pass the walls defining the flange recesses 123 to be fitted in the flange recesses 123. Thereby, the courtesy lamp 94 is assembled to the door trim 3. As described above, by rotating the courtesy lamp 94 with the extensions 120 as an axis, the courtesy lamp 94 can be easily placed in a proper position and assembled to the door trim 3.

When the courtesy lamp 94 has been assembled to the door trim 3, the retaining plates 133 respectively contact side surfaces of the courtesy lamp 94, and the claws 134 contact the tongues 124 from the back side. Thereby, the movement of the courtesy lamp 94 in directions along the door trim 3 and toward the back side of the door trim 3 is restricted. Further, because the edge wall projections 136 are fitted in the flange recesses 123, the movement of the lower part of the courtesy lamp 94 in directions toward the front side and back side of the door trim 3 as well as along the door trim 3 is restricted. In addition, because the extensions 120 are in contact with the back surface of the door trim 3, the movement of the upper part of the courtesy lamp 94 toward the front side of the door trim 3 is restricted. Thereby, the courtesy lamp 94 is fixed to the door trim 3.

Third Embodiment

A courtesy lamp 194 of the third embodiment differs from the courtesy lamp 194 of the first embodiment with regard to the shape of the base board 6, and the structures of the holder member 7 and the retaining member 8 are the same as those in the first embodiment. In the following, description will be made mainly of the shape of the base board 6 and the relationship between the base board 6 and the holder member 7 as well as between the base board 6 and the retaining member 8, and description of the other parts will be omitted. The structures of the holder member 7 and the retaining member 8 may be described with reference to the drawings for the first embodiment, as necessary.

Figure 20:
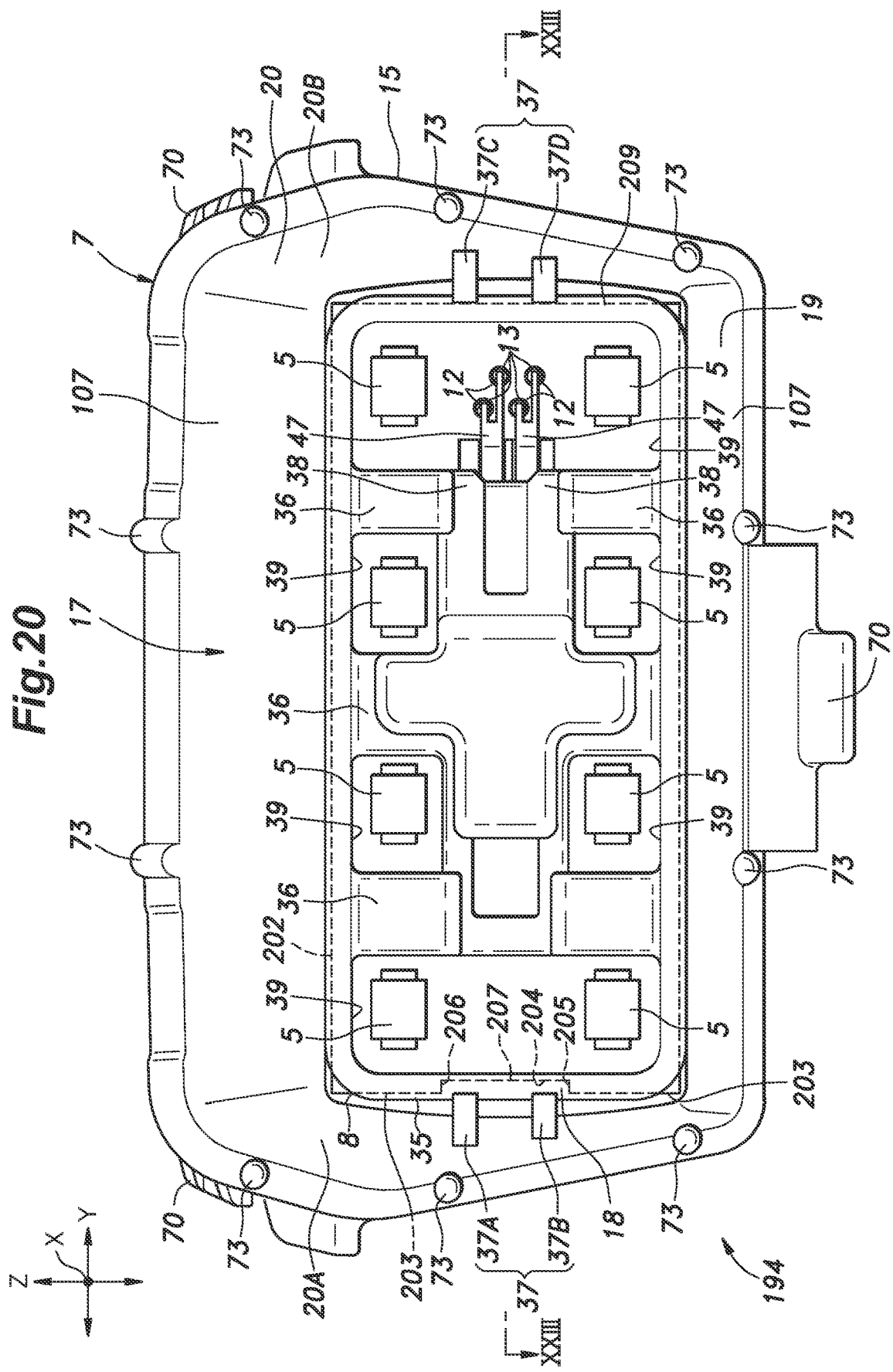
FIG. 20 is a side view of the lamp unit according to the third embodiment with the cover member removed.
Figure 21:
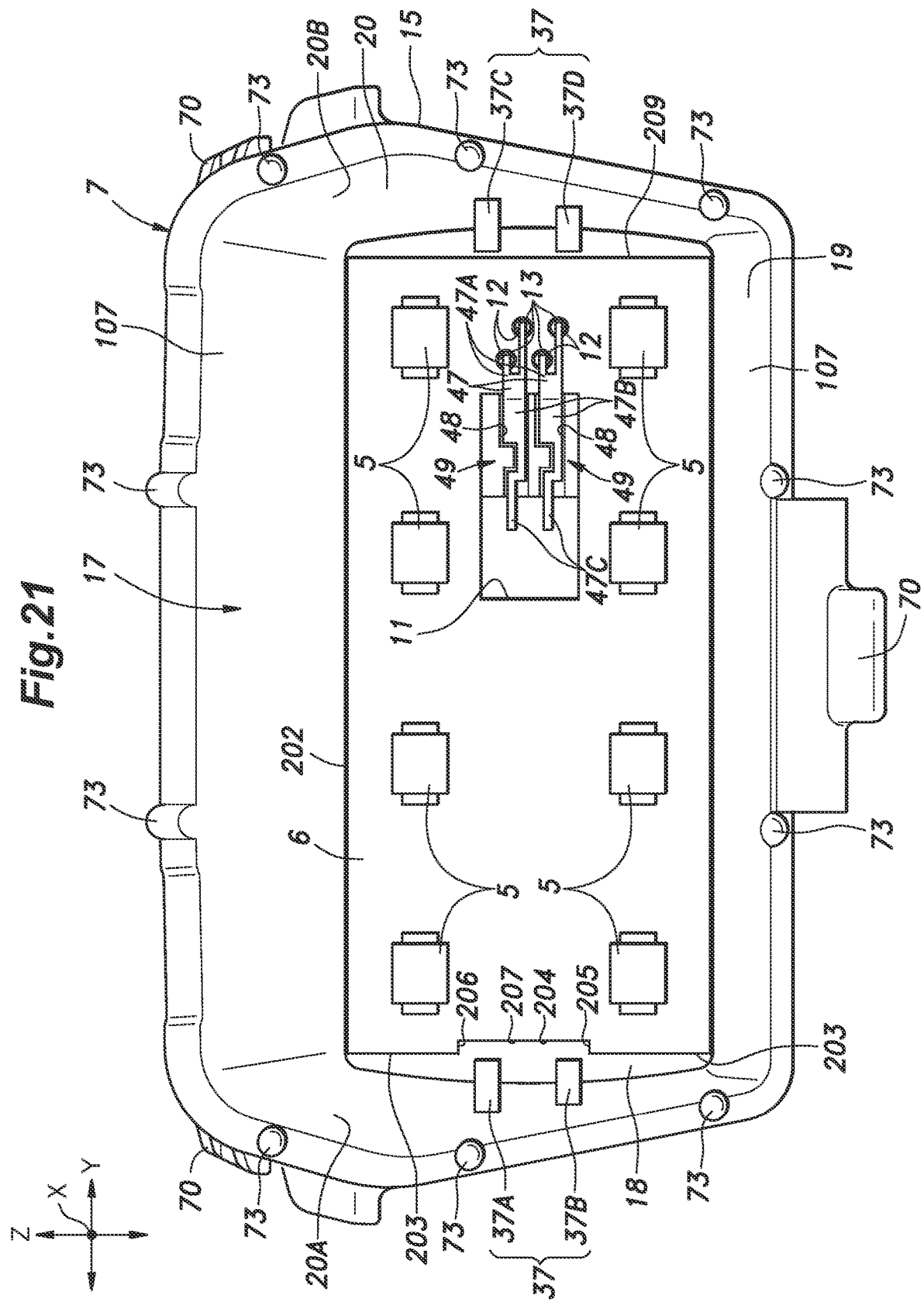
FIG. 21 is a side view of the lamp unit according to the third embodiment with the cover member and the retaining member removed.

The base board 6 is a printed circuit board having a flat plate-like shape and provided with electronic parts including the light-emitting elements 5, resistors, diodes, etc. (not shown) soldered onto a surface thereof. As shown in FIGS. 20 and 21, the base board 6 includes a plate-like base 202 having a substantially rectangular shape in plan view, and a single cutout 204 is formed at an approximately central part of one of the short sides of the base (hereinafter, a first short side 203) such that the cutout 204 extends inward of the base 202. The cutout 204 is formed on only the first short side 203 and is not formed on the other short side of the base 202 (hereinafter, a second short side 209). The cutout 204 is defined by a first edge wall 205 and a second edge wall 206, which extend substantially in parallel with the long side of the base 202, and a third edge wall 207 formed to be substantially in parallel with the short sides of the base 202. The light-emitting elements 5 are surface mount type LED elements that emit white light, but are not limited to this, and may be organic EL elements, light bulbs, etc. In the present embodiment, the light-emitting elements 5 are arranged in a grid pattern having two rows in the short-side direction and four columns in the long-side direction.

The base board 6 is formed with the rectangular through-hole 11 passed therethrough at an approximate center thereof and extending in the long-side direction of the base board 6 to have a substantially rectangular shape. The base board 6 is further formed with the four connection holes 12, which are substantially circular through-holes, adjacent to the rectangular through-hole 11 in the long-side direction of the base board 6. The lands 13 for soldering are provided on parts of the front surface of the base board 6 surrounding the openings of the connection holes 12.

As shown in FIGS. 2 and 23, the holder member 7 is a member made of resin and includes the housing part 15 and the connector part 16 protruding from the housing part 15 in the X-direction, which is a prescribed direction. The housing part 15 is formed with the housing recess 17 that is recessed in the X-direction on the side thereof opposite to the side coupled with the connector part 16. The housing recess 17 is defined by the housing recess bottom wall 18 perpendicular to the X-direction and the housing recess sidewall 19 provided along a circumference of the housing recess bottom wall 18.

Figure 22:
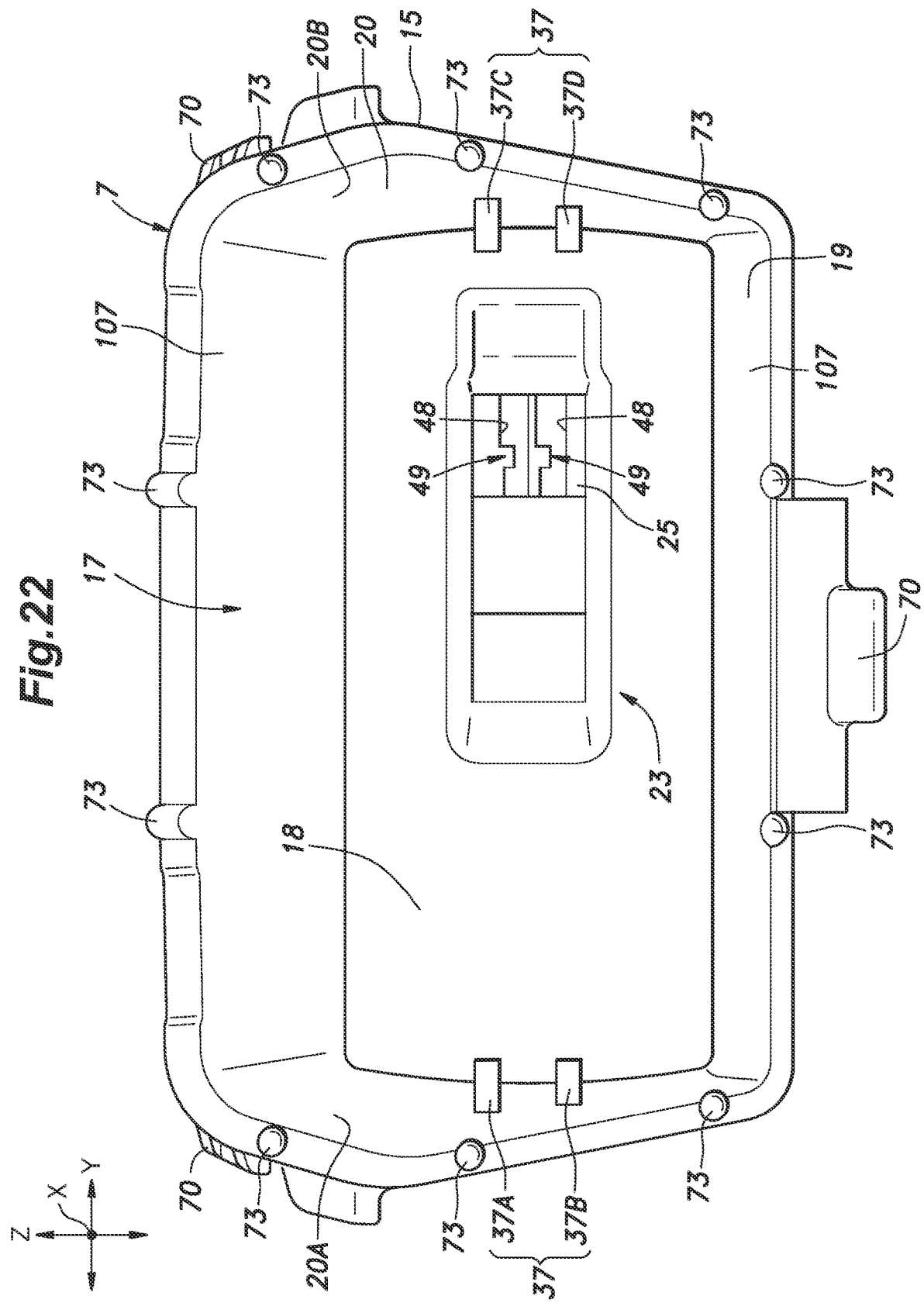
FIG. 22 is a side view of the holder member of the lamp unit according to the third embodiment.

As shown in FIG. 22, the housing recess bottom wall 18 has a substantially rectangular shape. In the following description, the direction along the long sides of the housing recess bottom wall 18 will be referred to as the Y-direction, and the direction along the short sides of the same will be referred to as the Z-direction. The housing recess sidewall 19 of the holder member 7 includes the housing recess lateral walls 20 respectively connected to the short sides of the housing recess bottom wall 18, and the housing recess longitudinal walls 107 respectively connected to the long sides of the housing recess bottom wall 18. The housing recess lateral walls 20 include a first lateral wall 20A and a second lateral wall 20B that face in the Y-direction toward each other to be substantially in parallel with each other. The housing recess longitudinal walls 107 include two longitudinal walls that face in the Z-direction toward each other to be substantially in parallel with each other.

As shown in FIG. 21, the base board 6 is housed in the housing recess 17 such that the main surface thereof faces in the X-direction. The base board 6 is disposed on the housing recess bottom wall 18 such that the first short side 203 extends along the first lateral wall 20A, and the back surface of the base board 6 is in contact with the housing recess bottom wall 18.

The retaining member 8 is disposed on the front side of the base board 6. The retaining member 8 is a member made of resin and having flexibility. As shown in FIG. 9, the retaining member 8 includes the outer frame 35 defining an outer edge of the retaining member 8 and having a substantially rectangular shape and the multiple vertical beams 36 provided between portions of the outer frame 35. The outer frame 35 is formed to have a substantially same shape as the edge portion of the base board 6.

Each of the housing recess lateral walls 20 is provided with the locking projections 37. As shown in FIG. 20, the first lateral wall 20A is provided with two locking projections 37; namely, a first locking projection 37A and a second locking projection 37B. The first locking projection 37A and the second locking projection 37B each protrude inward of the housing recess 17 along the Y-direction. The first locking projection 37A is positioned on one side of the second locking projection 37B in the Z-direction, and these projections are arranged side by side in parallel with the housing recess bottom wall 18. The second lateral wall 20B is provided with two locking projections 37; namely, a third locking projection 37C and a fourth locking projection 37D arranged side by side in parallel with the housing recess bottom wall 18. The third locking projection 37C and the fourth locking projection 37D each protrude inward of the housing recess 17 along the Y-direction. The first locking projection 37A and the third locking projection 37C face each other in the Y-direction, while the second locking projection 37B and the fourth locking projection 37D face each other in the Y-direction.

The first to fourth locking projection 37A to 37D each abut on the front surface of the outer frame 35. Thereby, the movement of the retaining member 8 in the direction away from the housing recess bottom wall 18 is restricted. In addition, as described above, since the base board 6 contacts the housing recess bottom wall 18 with the back surface thereof and contacts the back surface of the retaining member 8 with the front surface thereof, the retaining member 8 is locked by the first to fourth locking projection 37A to 37D, and the base board 6 is sandwiched between the retaining member 8 and the housing recess bottom wall 18.

As viewed in the X-direction, the cutout 204 faces the first locking projection 37A and the second locking projection 37B in the Y-direction, and the cutout 204 is in a position corresponding to the first locking projection 37A and the second locking projection 37B. Further, the cutout 204 is positioned between the housing recess bottom wall 18 and the outer frame 35 of the retaining member 8 in the X-direction.

The distance between an end of the first locking projection 37A in one Z-direction and an end of the second locking projection 37B in the opposite Z-direction is smaller than the distance between the first edge wall 205 and the second edge wall 206. Thus, a setting is made such that the first locking projection 37A and the second locking projection 37B can pass the cutout 204 simultaneously. Each of the distance between the protruding end of the first locking projection 37A and the protruding end of the third locking projection 37C and the distance between the protruding end of the second locking projection 37B and the protruding end of the fourth locking projection 37D is greater than the distance between the third edge wall 207 and the second short side 209. Therefore, at the time of assembly, the base board 6 can be easily moved to the housing recess bottom wall 18 by moving the part between the third edge wall 207 and the second short side 209 to pass between the protruding end of the first locking projection 37A and the protruding end of the third locking projection 37C and between the protruding end of the second locking projection 37B and the protruding end of the fourth locking projection 37D.

The retaining member 8 is provided with the horizontal beam 38 that connects approximate centers of the multiple vertical beams 36. In the present embodiment, the horizontal beam 38 connects all of the three vertical beams 36. The vertical beams 36 and the horizontal beam 38 extend between the adjoining light-emitting elements 5. The retaining member 8 is formed with the light passing holes 39 that extend therethrough in the X-direction, where the light passing holes 39 are defined at positions corresponding to the light-emitting elements 5 by cooperation of the outer frame 35, the vertical beams 36, and the horizontal beam 38. As shown in FIG. 23, the horizontal beam 38 is provided with the locking protrusion 40 that protrudes from the back surface in the X-direction.

The locking protrusion 40 extends through the rectangular through-hole 11 and protrudes into the locking recess 23 to be fitted into the same. Because the locking protrusion 40 extends through the rectangular through-hole 11, the movement of the base board 6 relative to the retaining member 8 in the direction perpendicular to the protruding direction of the locking protrusion 40 is restricted. Because the locking protrusion 40 is fitted into the locking recess 23, the movement of retaining member relative to the holder member 7 in the direction along the housing recess bottom wall 18 (X-direction and Y-direction) is restricted.

As shown in FIGS. 21 and 23, each connection terminal 47 includes, from the base end side thereof, the base end portion 47A, the intermediate portion 47B, and the protruding end portion 47C. A part of the base end portion 47A on the base end side thereof is bifurcated into two branches, each being inserted into the corresponding connection hole 12 and soldered onto the corresponding land 13. The base end portion 47A extends from the connection holes 12 toward the rectangular through-hole 11. A part of the base end portion 47A on the protruding end side is bent in the X-direction and extends into the rectangular through-hole 11 to be connected with the intermediate portion 47B. The intermediate portion 47B extends along the rectangular through-hole 11 to the back side of the base board 6 and passes between the locking protrusion longitudinal wall 46 and the locking recess longitudinal wall 30 to reach the locking recess bottom wall 25. The intermediate portion 47B is bent at the locking recess bottom wall 25 and is connected to the protruding end portion 47C. The protruding end portion 47C extends in the Y-direction along the locking recess bottom wall 25 (see FIG. 10). The locking recess bottom wall 25 is formed with the multiple grooves 48 extending in the direction from the locking recess longitudinal wall 30 toward the opening of the insertion recess 22 (Y-direction). In the present embodiment, the locking recess bottom wall 25 is formed with two grooves 48. The part of the protruding end portion 47C adjacent to the intermediate portion 47B is received in the corresponding groove 48, and as shown in FIGS. 10 and 23, the part of the protruding end portion 47C adjacent to the intermediate portion 47B is sandwiched between the locking recess bottom wall 25 and the first protruding end surface 43.

As shown in FIG. 23, the protruding end portion 47C extends in the groove 48 in the Y-direction and protrudes toward the opening of the insertion recess 22. The protruding end portion 47C protrudes substantially perpendicularly relative to the insertion recess bottom wall 26 and reaches between the second protruding end surface 44 and the second insertion recess lateral wall 28. The second protruding end surface 44 is positioned on the base end side than the first protruding end surface 43, and therefore, the second protruding end surface 44 is spaced from the locking recess bottom wall 25 in the X-direction. As a result, a gap is formed between the second protruding end surface 44 and the connection terminals 47, and the protruding end of the protruding end portion 47C protrudes from between the connecting surface 45 and the wall surface of the insertion recess bottom wall 26 which are continuous with each other. The second protruding end surface 44 is inclined such that the distance to the second insertion recess lateral wall 28 increases toward the opening of the insertion recess 22.

As shown in FIG. 3, the surface of the housing recess bottom wall 18 on the side of the protruding direction of the connector part 16 defines a bottom wall back surface 54 that is substantially perpendicular to the X-direction. The connector part 16 protrudes from the bottom wall back surface 54 in the X-direction, and the opening of the insertion recess 22 is located on the side of the protruding direction of the connector part 16 than the bottom wall back surface 54. As shown in FIG. 23, the opening edge of the insertion recess 22 is connected to the bottom wall back surface 54 via the inclined surface 55 which is inclined in the protruding direction of the connector part 16 as it approaches the opening of the insertion recess 22.

As shown in FIGS. 2 and 3, the outer surface of the housing part 15 is provided with the multiple locking claws 70 along the opening edge of the housing recess 17. As shown in FIG. 4, the cover member 9 is a plate-like member made of a light-transmissive resin. The cover member 9 is formed with the engagement holes 71 in an edge portion thereof. The cover member 9 is coupled to the opening of the housing recess 17 with the locking claws 70 engaging the engagement holes 71. As shown in FIG. 2, the opening of the housing recess 17 is closed by the cover member 9, whereby the holder member 7 and the cover member 9 cooperate to define the housing chamber 90 for housing the base board 6 and the retaining member 8.

The cover member 9 is made of a light-transmissive resin and, as shown in FIGS. 2 and 5, includes the cover sidewall 74 and the cover lower wall 75 connected to the cover sidewall 74 substantially perpendicularly. The cover sidewall 74 is colorless and transparent and has a substantially rectangular shape. The colored member 76 which is red and transparent is provided on the outer surface of the cover sidewall 74. As shown in FIG. 1, when the courtesy lamp 194 is attached to the door trim 3, the outer surface of the colored member 76 is continuous with the side surface of the door trim 3. The cover lower wall 75 is colorless and transparent and has a substantially rectangular shape. When the courtesy lamp 194 is attached to the door trim 3, the outer surface of the cover lower wall 75 is continuous with the lower surface of the door trim 3. In this embodiment, the cover member 9 is made of a light-transmissive resin. However, the cover member 9 may partially have a light-transmissive property.

When the vehicle door 1 is open, electric power is supplied to the light-emitting elements 5 via the cable 62, and the light-emitting elements 5 emit light. When the light-emitting elements 5 emit light, the cover sidewall 74 of the courtesy lamp 194 lights up in red. Thereby, the courtesy lamp 194 functions as a warning light for the vehicles coming from behind. At the same time, the cover lower wall 75 of the courtesy lamp 194 lights up in white, so that the courtesy lamp 194 functions to illuminate the foot area of the vehicle occupant getting in or out of the vehicle.

Next, effects of the courtesy lamp 194 with the above-described structure will be described.

At the time of assembly, the base board 6 is obliquely inserted into the housing recess 17 such that the second short side 209 faces the second lateral wall 20B, and thereafter, the base board 6 is rotated to move the first short side 203 toward the bottom of the housing recess 17 such that the base board 6 is placed in contact with the housing recess bottom wall 18. During this process, the first locking projection 37A and the second locking projection 37B simultaneously pass through the cutout 204, and therefore, the base board 6 can be placed easily without interfering with the first locking projection 37A and the second locking projection 37B. Further, because the cutout 204 is provided on only the first short side 203, the base board 6 has a high rigidity compared to a case where the cutout 204 is provided on each of the first short side 203 and the second short side 209. In addition, because the cutout 204 is provided on only the first short side 203, the base board 6 can be formed easily.

Moreover, because the cutout 204 is configured such that the first locking projection 37A and the second locking projection 37B can simultaneously pass therethrough, there is no need to form the cutout 204 in the base board 6 at each of the positions respectively corresponding to the first locking projection 37A and the second locking projection 37B. Therefore, the shape of the base board 6 can be simplified, and the base board 6 can be formed easily.

Because the cutout 204 is provided on the outer peripheral edge of the base board 6, the base board 6 can be placed easily without interfering with the first locking projection 37A and the second locking projection 37B. Further, because the cutout 204 is provided at an approximately central part of the first short side 203, when a load is applied to the first short side 203, the load does not concentrate on one of the two ends of the first short side 203, and thus, the load does not tend to be applied to the base board 6 unevenly. Therefore, deformation of the base board 6 does not occur easily.

The cutout 204 is positioned between the outer frame 35 and the housing recess bottom wall 18. Therefore, the cutout 204 is prevented from being hit by an object easily, and deformation of the base board 6 does not occur easily. Because the cutout 204 is sandwiched between the outer frame 35 and the housing recess bottom wall 18, the first short side 203 can be retained more firmly between the outer frame 35 and the housing recess bottom wall 18. Thereby, the retaining member 8 can be retained stable between the locking projections 37 and the housing recess bottom wall 18.

Owing to the light passing holes 39, the light from the light-emitting elements 5 reaches the opening of the housing recess 17 without being obstructed by the retaining member 8. Further, because the retaining member 8 is formed with the light passing holes 39, the retaining member 8 has a lighter weight than when formed in a plate-like shape. In addition, because the horizontal beam 38 connects the vertical beams 36 and is not coupled to the outer frame 35, the outer frame 35 is easy to bend in the Y-direction, and the assembly of the retaining member 8 is easy.

Concrete embodiments have been described in the foregoing, but the present invention is not limited to the above embodiments and may be modified or altered in various ways. In the above embodiment, the opening of the housing recess 17 was closed by the cover member 9, such that the entirety of the retaining member 8 and the base board 6 was covered, but the present invention is not limited to this embodiment. For instance, an embodiment in which at least part of the retaining member 8 and at least part of the base board 6 are covered by the cover member 9 may be possible, and in such a case, the cover member 9 can protect the retaining member 8 from an external load by covering a part of the retaining member 8, and therefore, damage to the retaining member 8 can be prevented. Further, the cover member 9 can protect the base board 6 from an external load by covering a part of the base board 6, and therefore, damage to the base board 6 can be prevented.

In the third embodiment described above, each of the first lateral wall 20A and the second lateral wall 20B was provided with two locking projections 37, but three ore more locking projections 37 may be provided. In such a case, it is preferred if at least two of the locking projections 37 can simultaneously pass through a single cutout 204.

In the above embodiment, the lamp unit was applied to the courtesy lamp 4, 94, 194, but the present invention is not limited thereto. For instance, the lamp unit may be applied to various automotive lights such as headlights, blinkers, fog lights, tail lights, brake lights, reversing lights, license plate lights, room lamps, etc. Further, the lamp unit may be applied to bicycle lights, flashlights, etc.

The locking projections 37 may be formed at positions that align with the second projections 102 in the Z-direction. With such a configuration, the locking projections 37 abut on an end part of the outer frame 35 that is hard to deform, whereby the base board 6 and the retaining member 8 are prevented from falling off from the housing recess 17 more reliably.

Further, a configuration may be made such that when the flange portion 121 is pushed in to the back side of the door trim 3, the retaining plates 133 flex outward of the door trim opening 130 so that after the attachment is completed, the retaining plates 133 are in press-contact with the tongues 124. A configuration may also be made such that the courtesy lamp 4 is attached to the door trim 3 with the claws 134 engaging the edge portion of the cover member 9.

Also, the holder member 7 may be formed integrally with the door trim 3, and the cover member 9 may be configured to be detachably attached to the door trim 3.

Glossary 3 door trim (attachment object)
4 courtesy lamp (lamp unit) according to first embodiment
5 light-emitting element
6 base board
7 holder member
8 retaining member
9 cover member
11 through-hole
17 housing recess
18 housing recess bottom wall (recess bottom wall)
19 housing recess sidewall (recess sidewall)
22 insertion recess (connector insertion recess)
23 locking recess
35 outer frame
36 vertical beam
37 locking projection (engagement portion)
38 horizontal beam
39 light passing hole
40 locking protrusion
43 first protruding end surface
44 second protruding end surface
47 connection terminal
48 groove
55 inclined surface
60 connector
80 connector insertion hole
90 housing chamber
94 courtesy lamp (lamp unit) according to second embodiment
101 first projection
102 second projection
194 courtesy lamp (lamp unit) according to third embodiment
203 first short side
204 cutout

The invention claimed is:

1. A lamp unit, comprising:
a holder member configured to be attached to an attachment object;
a base board provided with a light-emitting element on a main surface thereof;
a retaining member that engages the holder member to sandwich the base board between the retaining member and the holder member such that the base board is retained at a prescribed position on the holder member; and
a cover member that is at least partially light-transmissive and is attached to the holder member such that the cover member cooperates with the holder member to define a housing chamber for housing the base board and the retaining member,
wherein the holder member has a housing recess for housing the base board and the retaining member,
wherein the holder member comprises a connector insertion recess to which a connector is inserted to be connected the base board,
wherein a bottom wall of the housing recess has a rectangular shape,
wherein the connector insertion recess opens between the bottom wall of the housing recess and an outer surface of the holder member towards an elongation direction of the bottom wall of the housing recess, and
wherein an inclined surface is formed at an outer surface of the bottom wall to be inclined in such a direction that the inclined surface approaches an opening edge of the connector insertion recess along an insertion direction of the connector.

2. The lamp unit according to claim 1, wherein the bottom wall of the housing recess of the holder member is provided with a locking recess, and a corresponding part of the retaining member is provided with a locking protrusion that protrudes into the locking recess.

3. The lamp unit according to claim 2, comprising connection terminals to connect terminals of the connector with the base board,
wherein the locking recess and the connector insertion recess are connected to each other, and
wherein the connection terminals extend from the base board to the connector insertion recess by passing between the locking protrusion and a bottom wall of the locking recess.

4. The lamp unit according to claim 3, wherein the connection terminals are sandwiched between the locking protrusion and the bottom wall of the locking recess.

5. The lamp unit according to claim 1, wherein the holder member includes a housing part equipped with the housing recess and a protruding part protruding from the housing part, and the connector insertion recess opens at the protruding part.

6. The lamp unit according to claim 5, wherein the connector insertion recess opens at the protruding part and extends along the direction of the elongation direction of the bottom wall of the housing recess.

7. The lamp unit according to claim 6, wherein a locking portion is formed on an outer surface of the connector, and a locking hole engaged to the locking portion is formed close to an opening of the connector insertion recess at the protruding part.

8. A door trim comprising the lamp unit according to claim 1.

9. A manufacturing method of a lamp unit, wherein the lamp unit comprises
- a holder member configured to be attached to an attachment object;
- a base board provided with a light-emitting element on a main surface thereof;
- a retaining member that engages the holder member to sandwich the base board between the retaining member and the holder member such that the base board is retained at a prescribed position on the holder member; and
- a cover member that is at least partially light-transmissive and is attached to the holder member such that the cover member cooperates with the holder member to define a housing chamber for housing the base board and the retaining member, and wherein the method includes:
- a step to engage the holder member to sandwich the base board between the retaining member, and
- a step to attach the cover member to the holder member.

* * * * *